United States Patent [19]

Imahashi et al.

[11] Patent Number: 5,529,630
[45] Date of Patent: Jun. 25, 1996

[54] APPARATUS FOR MANUFACTURING A LIQUID CRYSTAL DISPLAY SUBSTRATE, AND APPARATUS FOR EVALUATING SEMICONDUCTOR CRYSTALS

[75] Inventors: Issei Imahashi, Yamanashi-ken; Kiichi Hama, Chino; Jiro Hata, Yamanashi-ken, all of Japan

[73] Assignee: Tokyo Electron Limited, Tokyo, Japan

[21] Appl. No.: 385,929

[22] Filed: Feb. 9, 1995

Related U.S. Application Data

[62] Division of Ser. No. 153,376, Nov. 16, 1993, Pat. No. 5,413,958.

[30] Foreign Application Priority Data

Nov. 16, 1992 [JP] Japan .................................. 4-330073
Jan. 25, 1993 [JP] Japan .................................. 5-29975

[51] Int. Cl.$^6$ .................................................. H01L 21/26
[52] U.S. Cl. ........................... 118/665; 118/620; 437/174; 148/DIG. 6; 148/DIG. 90; 422/108; 250/354.1; 250/492.23
[58] Field of Search ...................... 118/620, 665; 148/DIG. 90, DIG. 91, DIG. 92, DIG. 93, DIG. 94, DIG. 3, DIG. 6, DIG. 95; 437/174; 422/108; 250/354.1, 492.2, 492.23

[56] References Cited

U.S. PATENT DOCUMENTS

| 4,292,091 | 9/1981 | Togei . |
| 4,309,225 | 1/1982 | Fan et al. . |
| 4,322,253 | 3/1982 | Pankove et al. . |
| 4,724,219 | 2/1988 | Ridinger . |
| 4,931,132 | 6/1990 | Aspnes et al. . |

FOREIGN PATENT DOCUMENTS

| 63-54715 | 3/1988 | Japan . |
| 176715 | 3/1989 | Japan . |
| 1179315 | 7/1989 | Japan . |
| 3268318 | 11/1991 | Japan . |
| 3248574 | 11/1991 | Japan . |

*Primary Examiner*—Jeffrey R. Snay
*Attorney, Agent, or Firm*—Oblon, Spivak, McClelland, Maier & Neustadt

[57] ABSTRACT

An amorphous silicon film is formed on a glass substrate by a CVD method, and then the island regions of the amorphous silicon film is changed to a plurality of polycrystalline silicon regions which are arranged in a line and apart with each other in a predetermined distanced by intermittently irradiating laser pulses each having the same dimensions as those of the island region onto the amorphous silicon film, using a laser beam irradiating section. Switching elements including the island regions as semiconductor regions are formed by etching and film-forming process to constitute a driving circuit section. The section is divided to gate driving circuit sections and source driving circuit sections for driving thin film transistors formed in a pixel region.

1 Claim, 13 Drawing Sheets

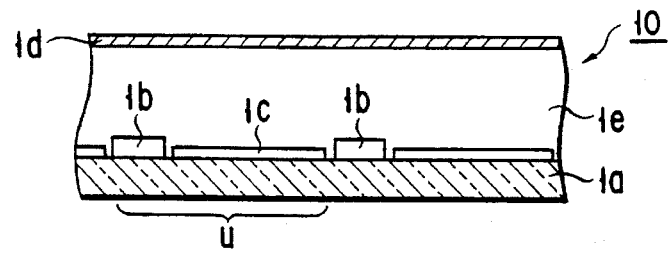
FIG. 1
PRIOR ART
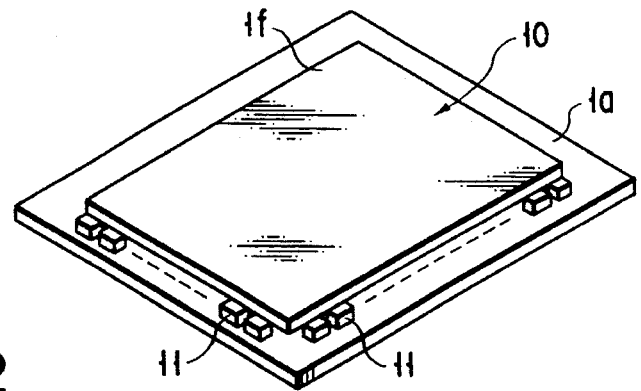
FIG. 2
PRIOR ART
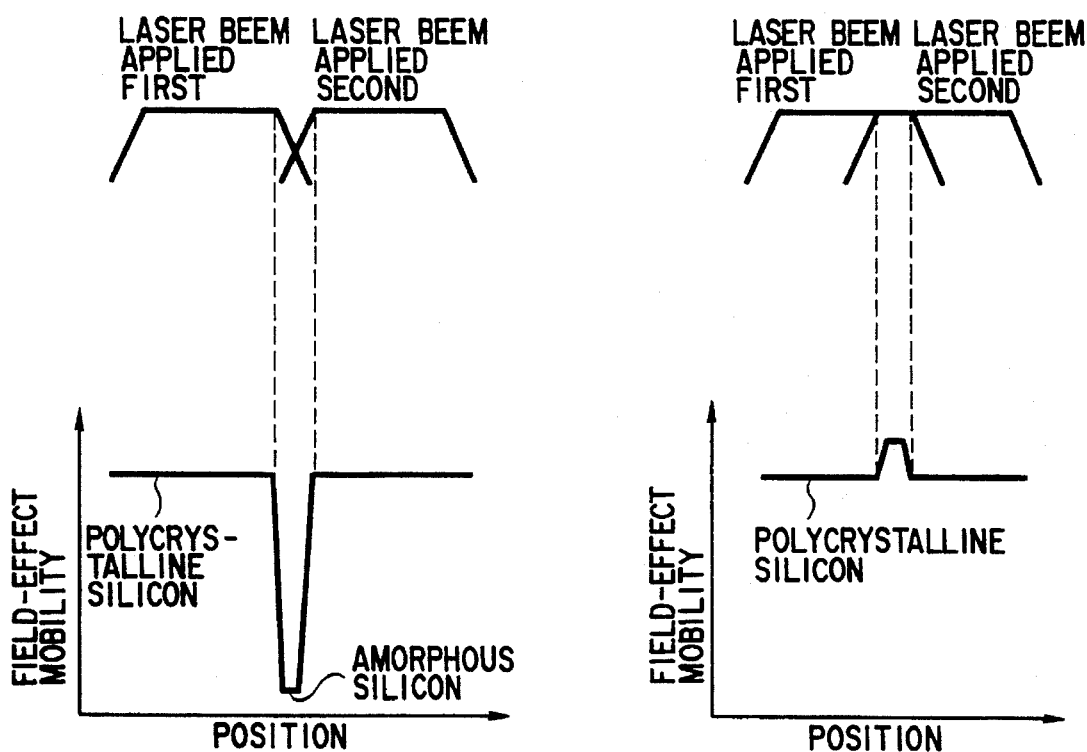
FIG. 3A
PRIOR ART
FIG. 3B
PRIOR ART

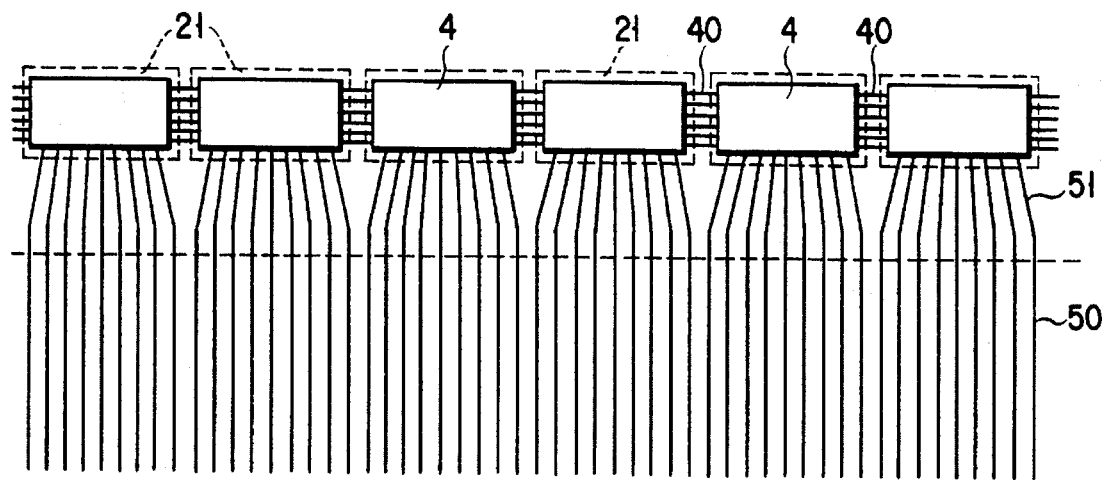
F I G. 5B
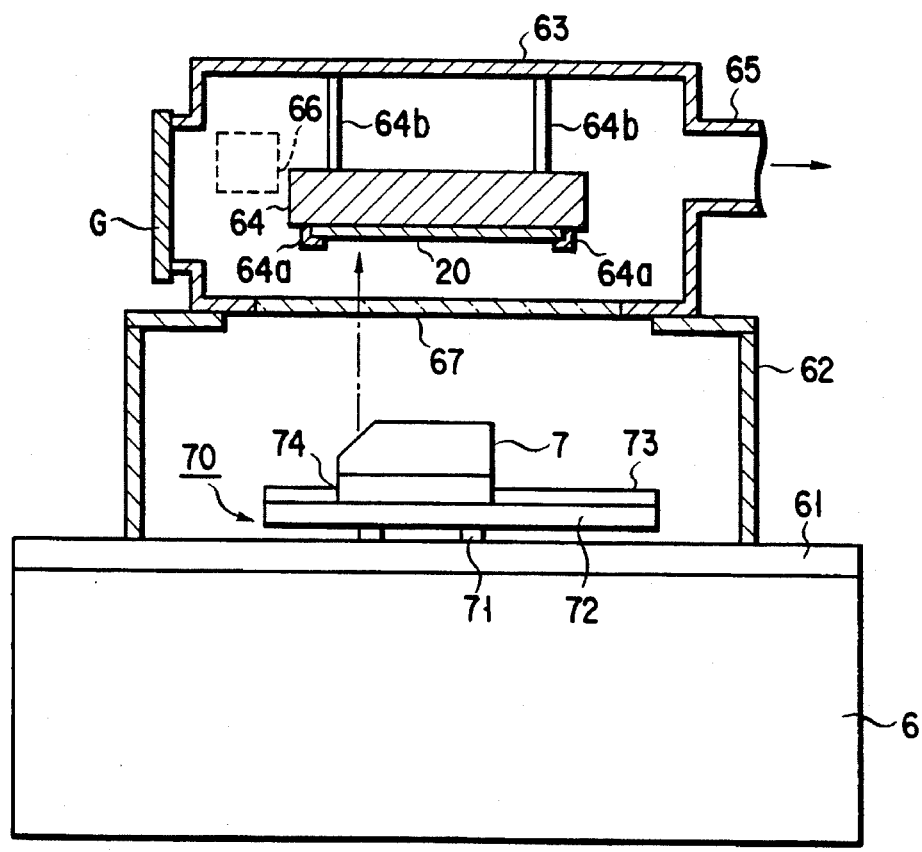
F I G. 6

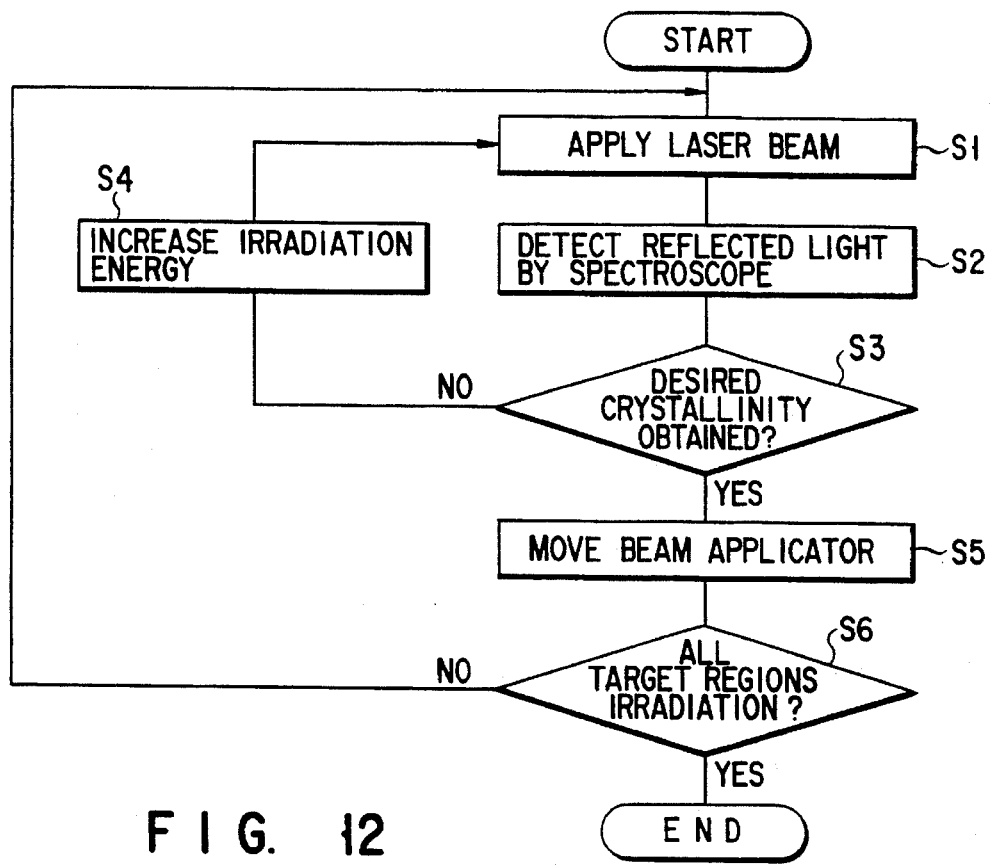
F I G. 12
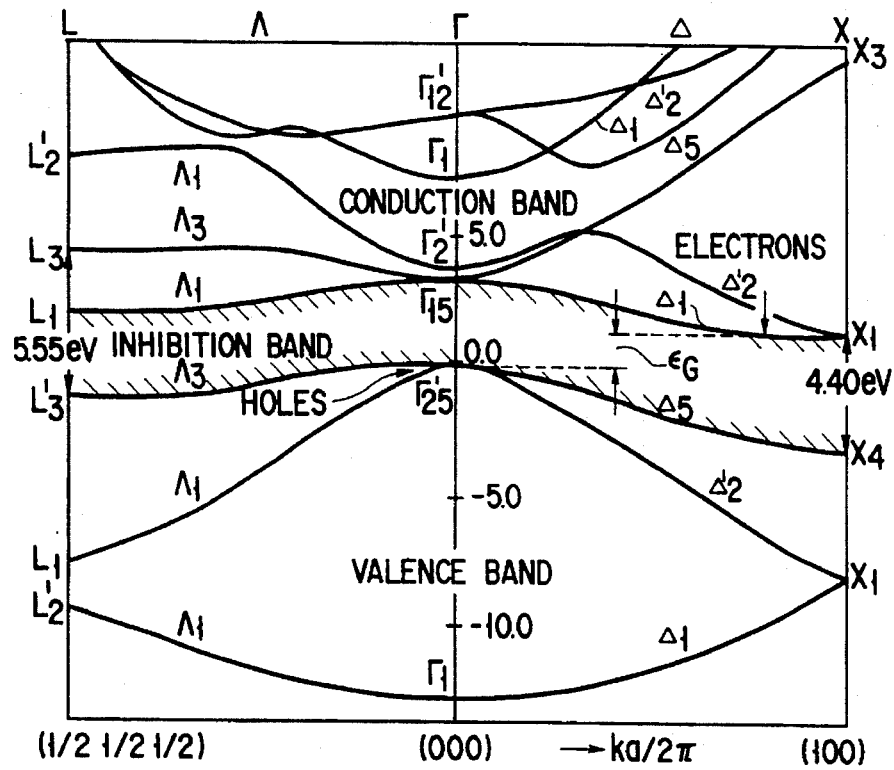
F I G. 13   ENERGY-BAND CONFIGURATION OF SILICON

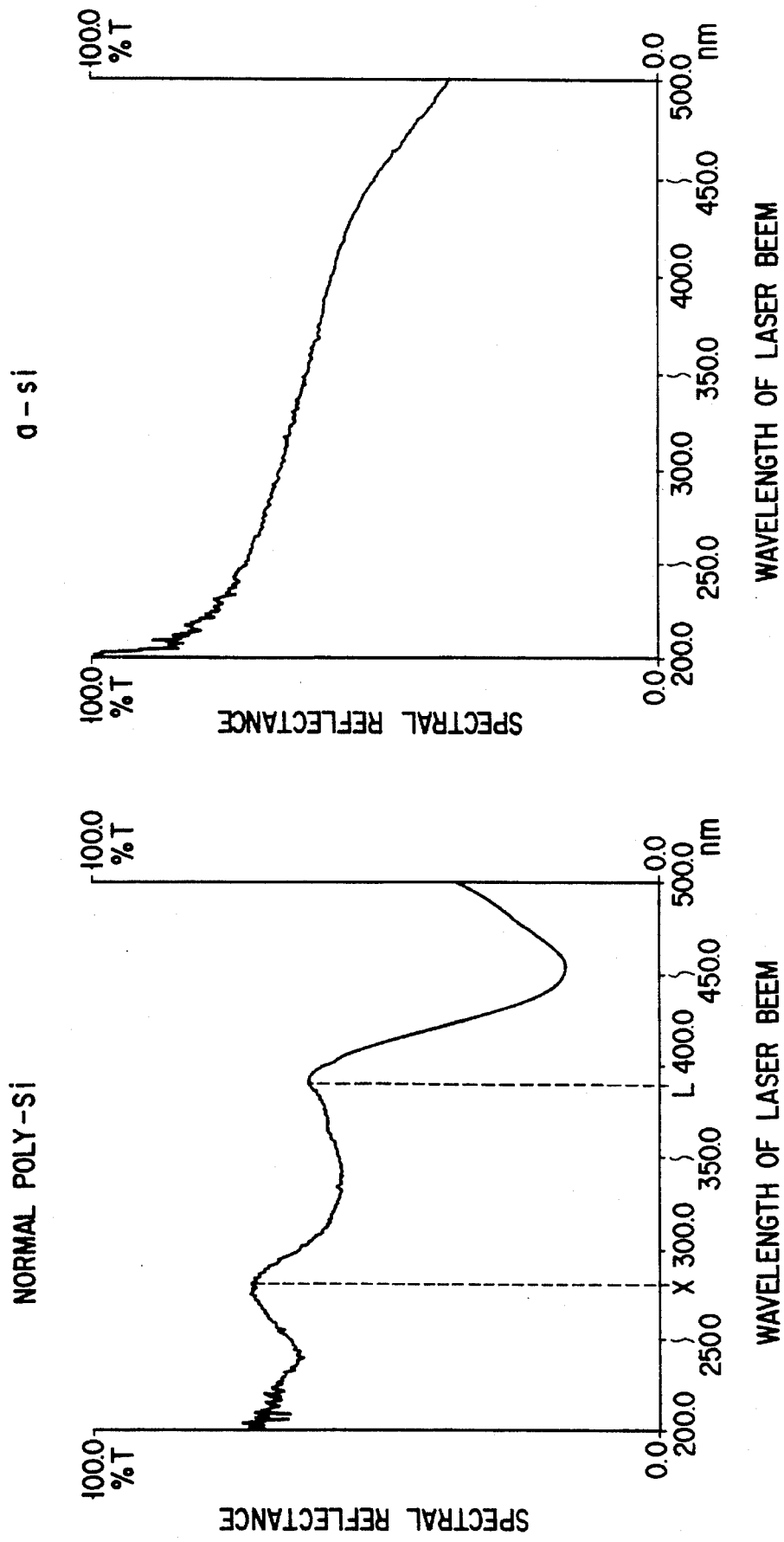

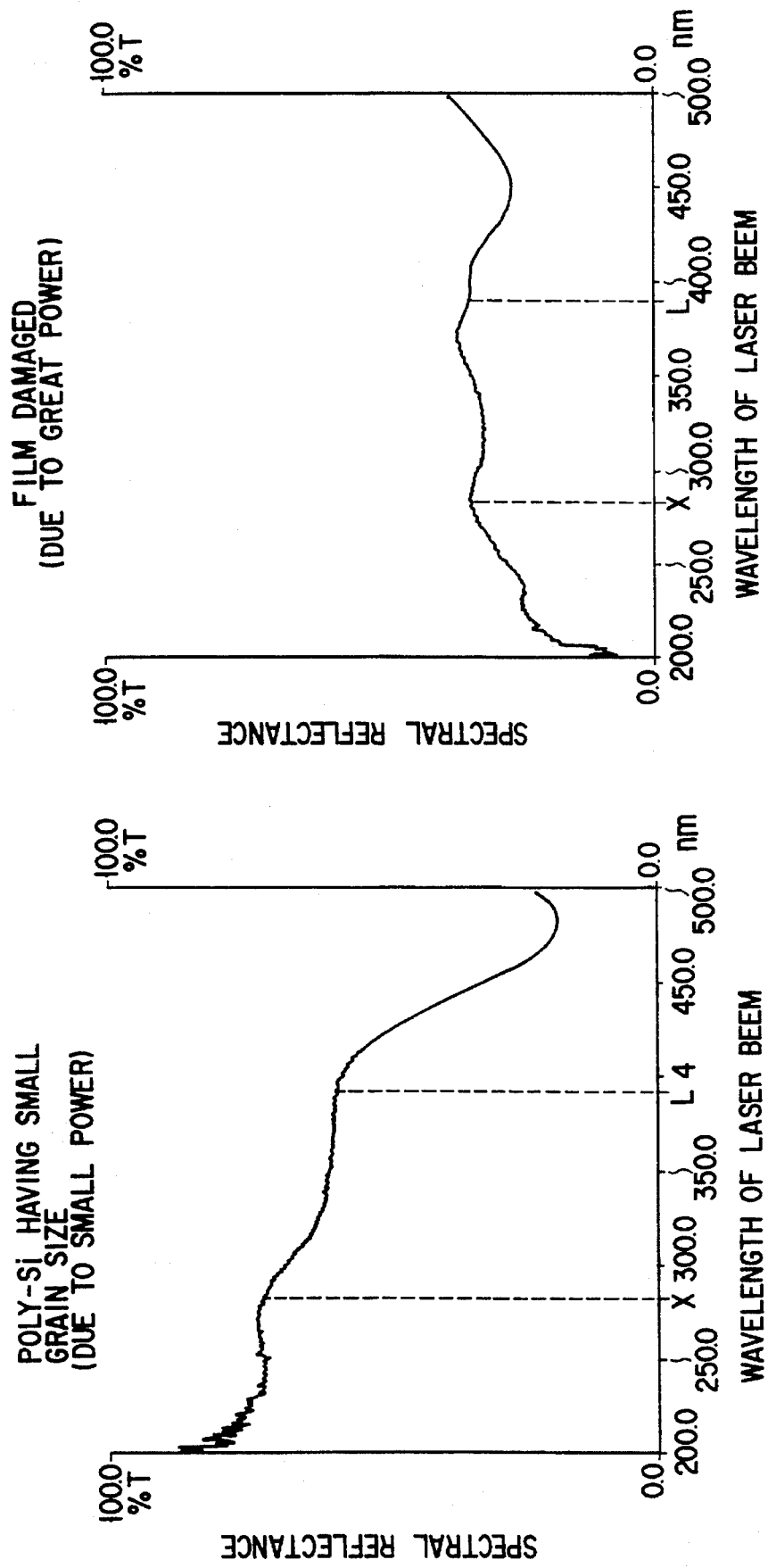

APPARATUS FOR MANUFACTURING A LIQUID CRYSTAL DISPLAY SUBSTRATE, AND APPARATUS FOR EVALUATING SEMICONDUCTOR CRYSTALS

This is a Division of application Ser. No. 08/153,376 filed on Nov. 16, 1993, U.S. Pat. No. 5,413,958.

BACKGROUND OF THE INVENTION

1. Field of the Invention

The present invention relates to a method and an apparatus for manufacturing a liquid crystal display substrate, and more particularly to a method of manufacturing a liquid crystal display substrate having a drive circuit for driving switching elements, and apparatus and method for evaluating semiconductor crystals.

2. Description of the Related Art

LCDs (Liquid Crystal Displays) having TFTs (Thin-Film Transistors) used as switching elements can display images of very high quality. Therefore, they are useful and attracting much attention.

FIG. 1 is a sectional view of the substrate of an LCD. As shown in the figure, TFTs 1b are formed on the center parts of a glass substrate 1a. Pixel electrodes 1c are formed on the center region of the substrate 1a, spaced apart from the TFTs 1b, and electrically connected to the drains of the TFTs 1b, respectively. Each TFT 1b and the pixel electrode associated with the TFT 1b constitute a square pixel unit U having sides of hundreds of microns. Hundreds of thousands of pixel units U are arranged on the glass substrate 1a.

The LCD substrate further comprises a transparent electrode 1d and a transparent substrate 1f. The transparent electrode 1d, which is used common to the pixel units U, is formed on the transparent substrate 1f. The substrate 1f is so positioned that the electrode 1d is spaced apart by a predetermined distance from the center part of the glass substrate 1a, opposing the pixel units U. The gap between the transparent electrode 1d and the center part of the glass substrate 1a is filled with liquid crystal 1e. The center part of the glass substrate 1a, the pixel units U, the liquid crystal 1e, the transparent electrode 1d, and the transparent substrate 1f constitute a pixel section 10.

FIG. 2 is a perspective view of the LCD substrate. As shown in this figure, the LCD substrate further comprises packaged IC chips 11 on the exposed portion of the glass substrate 1a, and around the sides of the pixel section 10. The IC chips 11 form a gate driver. The terminals of the IC chips 11 are coupled to scanning electrode lines which in turn are connected to the gate and drain electrodes of the pixel units U.

How to manufacture the LCD substrate shown in FIGS. 1 and 2 will be described. First, a film of hydrogenated amorphous silicon (a-SiH) is formed on the glass substrate 1a by means of, for example, plasma CVD method. Then, various films and layers are formed on the amorphous silicon film and subjected to various processes (including etching), forming a number of TFTs 1b, pixel electrodes 1c connected to the TFTs 1b, and scanning electrode lines (not shown) connected to the pixel electrodes 1c. A number of pixel units U, forming a block, are thereby prepared. Next, packaged IC chips 11 are mounted on the glass substrate 1a, around the block of pixel units U. The IC chips 11 are aligned with the respective scanning electrode lines of the pixel units U and electrically connected thereto subsequently. Thereafter, the transparent substrate 1f, with the transparent electrode 1d formed on it, is positioned in place, so that the electrode 1d is spaced apart by a predetermined distance from the center part of the glass substrate 1a, opposing the pixel units U. Liquid crystal 1e is applied into the gap between the electrode 1d and the center part of the glass substrate 1a. As a result, the pixel section 10 is fabricated.

There is a demand for a TFT-LCD which has a large display screen and which can display color images of high quality. To meet the demand, it is necessary to use a gate driver which has as many as 400 lines, and a source driver which has as many as 1920 lines. Inevitably it requires a large number of machine-hours to align these lines with the scanning electrode lines of the pixel units, respectively, before electrically connected to the scanning electrode lines. This is one factor of raising the price of the TFT-LCD.

To reduce the price of the TFT-LCD it is desirable that the lines for connecting the gate and source drivers to the pixel section be formed simultaneously with the switching elements of the pixel section. Once the lines of the drivers are so formed, the driver will be connected to the pixel section when they are formed on that portion of the glass plate which extends outside the pixel section. This method of forming the lines simultaneously with the switching elements of the pixel section would save many machine-hours and is a very useful method.

The TFTs of the pixel unit, which are used to display an image, need not operate at high speed. In contrast, it is required of the gate and source drivers, both used for switching the TFTs fast, should operate at much higher speed than the TFTs. In other words, the drivers must have the same operating speed as IC chips. The drivers must therefore comprises a semiconductor film of polycrystalline silicon which have higher field-effect mobility than amorphous silicon.

To form a polycrystalline silicon film on a glass substrate, it is necessary to perform pressure-reduced CVD method at 600° C. or more, at which temperature a substrate of cheap glass will warp. Hence, the substrate must be made of expensive glass such as a quartz glass which would not warp at such high temperatures. This will ultimately raise the manufacturing cost of the TFT-LCD.

A method of forming a polycrystalline silicon film on a substrate of cheap glass, without warping the substrate, has been proposed to avoid an increase in the manufacturing cost of the TFT-LCD. The method comprises the step of forming a large film of hydrogenated amorphous silicon (hereinafter referred to as "a-Si:H") by, for example, plasma CVD in an atmosphere of about 300° C., and the step of applying a laser beam onto the a-Si:H film, thereby raising the surface temperature thereof to about 1200° C. and thus converting the surface region of the a-Si:H film to a polycrystalline silicon film. The polycrystalline silicon film, thus formed can be used as the semiconductor film of the gate and source drivers.

The a-Si:H film formed can be large and of high quality since it is formed at a temperature as low as about 300° C. The application of a laser beam onto the a-Si:H film (i.e., laser annealing) lasts but an extremely short time, for example only 23 nsec in the case of a KrF laser beam and the heat does not reach the glass substrate. Hence, the substrate need not be so heat resistant and can be made of cheap glass. Furthermore, since the a-Si:H film is formed at low temperature and over a large area, the polycrystalline silicon film is equally large because it is the region of the a-Si:H film, which has been crystallized with a laser beam.

This helps to produce a large-screen LCD of transmission type.

When applied with a laser beam, the a-Si:H film generates hydrogen, which may damage the film. To prevent such a damage, many ideas have been propose in respect of methods of applying laser beams, the energy of each laser beam to apply, and the like. The present inventors has been studying a method of applying laser beam pulses onto a strip-shaped target region of a rectangular a-Si:H film, which extends along at least one side of the film, thereby crystallizing the target regions. (Drive circuit sections of an LC substrate may be formed in the strip-shaped region thus crystallized.) This method, however, has the following problems.

FIGS. 3A and 3B are diagrams, each illustrating the relationship between the positions of two adjacent laser beams applied to an a-Si:H film, on the one hand, and the field-effect mobility in the film, on the other. Each laser beam has an intensity which is uniformly distributed in the direction parallel to the a-Si:H film and which diverges toward the a-Si:H film.

In the case where the adjacent two laser beams do not overlap at all, as shown in FIG. 3A, no laser-beam energy is applied to that region of the film which lies between the regions thereof irradiated with the laser beams. This region therefore remains not crystallized, whereas the irradiated regions are crystallized. Polycrystalline silicon and a-Si:H and polycrystalline silicon have field-effect mobility of 30 to 600 $cm^2/V$ s and 0.3 to 1 $cm^2/V$ s, respectively. The field-effect mobility of polycrystalline silicon is two orders of magnitude greater than that of a-Si:H. An a-Si:H region is formed in the polycrystalline silicon region, the drive circuit sections formed in the strip-shaped region crystallized with laser beams successively applied to the a-Si:H film will greatly differ in their operating characteristic.

In the case where the adjacent two laser beams overlap at least in part, as shown in FIG. 3B, a portion of the a-Si:H film is irradiated two times to have field-effect mobility higher than the remaining portion of the a-Si:H film, despite that each laser beam has an intensity which is uniformly distributed in the direction parallel to the a-Si:H film. This is because polycrystalline silicon and a-Si:H have melting points of 1414° C. and 1000° C., respectively, so that the sizes of their grains vary. The polycrystalline silicon film cannot be uniform in terms of field-effect mobility (In FIG. 3B, the irregular portion has a higher mobility as shown by a projection curve, typically, but may has a lower mobility.)

SUMMARY OF THE INVENTION

The object of the present invention is provide a method of manufacturing an LCD substrate in which a drive circuit sections for driving pixels of an LCD may be effectively formed on a substrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a sectional view graphically showing a part of an LCD substrate of ordinary type;

FIG. 2 is a perspective view of the LCD substrate of the ordinary type;

FIGS. 3A and 3B are diagrams, each illustrating the relationship between the positions of two adjacent laser beams applied to an a-Si:H film, on the one hand, and the field-effect mobility in the film, on the other;

FIG. 5B is a plan view showing one of the identical shift registers used in the embodiment, and also the output lines of the shift register;

FIG. 6 is a schematic representation of a laser annealing apparatus used in the embodiment of the present invention;

FIG. 12 is a flow chart explaining how the crystallized condition of a semiconductor film is evaluated;

FIG. 13 is a diagram illustrating the energy band configuration of silicon crystal;

FIG. 14 is a graph representing the distribution of band-gap spectral reflectance of a reference semiconductor crystal;

FIG. 15 is a graph for showing a distribution of a band-gap spectral reflectance of amorphous silicon;

FIG. 16 is a graph for showing a distribution of a band-gap spectral reflectance of silicon, where the irradiation laser energy is not sufficient;

FIG. 17 is a graph for showing a distribution of a band-gap spectral reflectance of silicon, where the irradiation laser energy is excess;

DETAILED DESCRIPTION OF THE PREFERRED EMBODIMENTS

Embodiments of the present invention will now be described, with reference to the accompanying drawings.

First, a method of manufacturing an LCD substrate 10, according to the invention, will be described with reference to FIGS. 4A to 4B and FIGS. 5A and 5B.

Figures 4A, 4B:
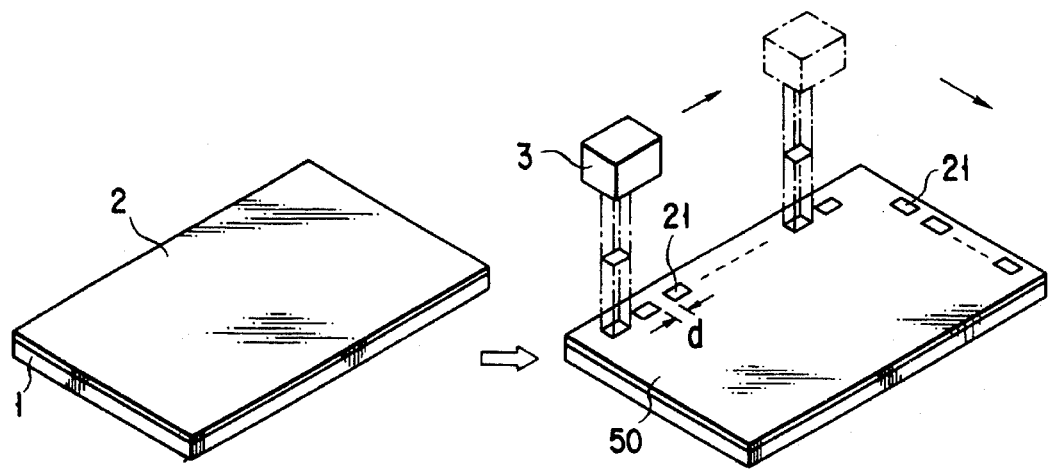
FIGS. 4A to 4D are perspective views for explaining an embodiment of the invention, i.e., a method of manufacturing an LCD substrate.

As shown in FIG. 4A, an amorphous silicon film 2 is formed on a light-transmitting substrate 1 made of, for example, glass, by means of pressure-reduced CVD method. In the CVD method, monosilane ($SiH_4$) gas or disilane ($Si_2H_6$) gas is used as reactive gas, the substrate 1 is held at 450° to 520° C., and the CVD vessel is maintained at a few Torr.

Next, as shown in FIG. 4B, a laser device 3 intermittently emitting a laser beam having a rectangular cross section having sides of several millimeters is moved above the substrate 1, along a long side and a short side of the substrate 1 by a predetermined manner. As a result, the beam irradiates discrete, island-shaped surface regions of the amorphous silicon film 2 on the substrate 1, which are located along the long side and the short side of the substrate 1 and spaced apart by a prescribed distance d of, for example, several millimeters. These surface regions of the film 2 are thereby converted into rectangular polycrystalline silicon (polysilicon) regions 21.

The laser device 3 is, for example, an excimer laser such as a KrF laser (pulse width: 23 nsec) or an XeCl laser (pulse width: 25 nsec). To form each polysilicon region 21, the laser device 3 may apply one beam pulse to a target region of the amorphous silicon film 2, said beam having an energy density (i.e., energy applied per unit area) high enough to change amorphous silicon to polysilicon. Alternatively, for the same purpose, the laser device 3 may apply two or more beam pulses having a less density to the target region of the amorphous silicon film 2.

Figures 4C, 4D:
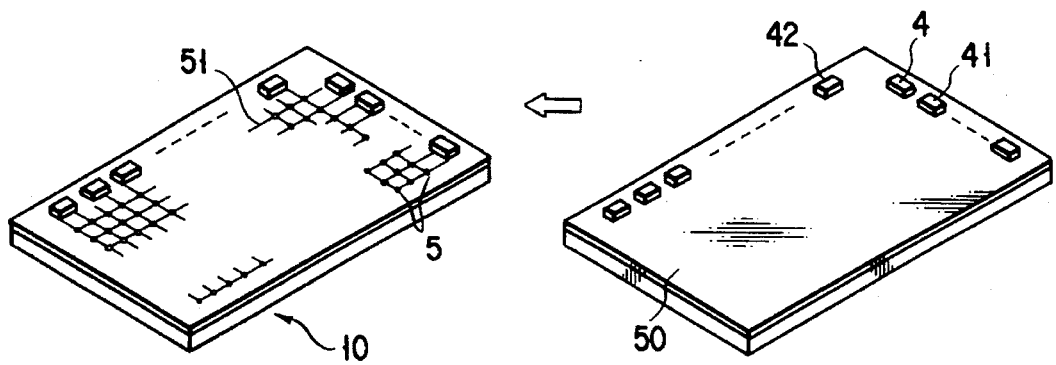
Figure 5A:
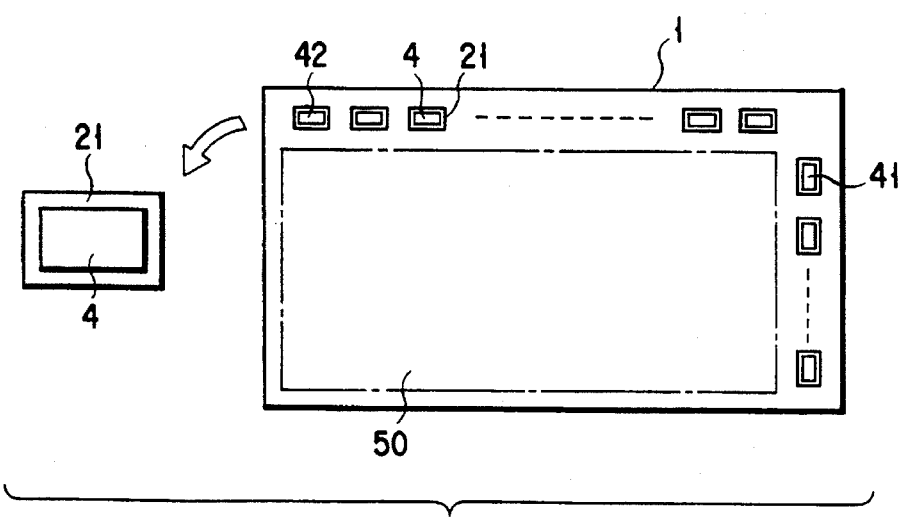
FIG. 5A consists of two plan views both showing the positional relationship between the polysilicon regions of the embodiment and the driver circuits formed on the polysilicon regions.

Thereafter, as shown in FIG. 4C, etching and film-forming processes are repeatedly performed on the polysilicon regions 21, thereby forming drive circuits 4. Each drive circuit is, for example, an LSI of a known type comprising semiconductor elements (switching elements). Of these drive circuits 4, those arranged along the short side of the substrate 1 constitute a gate-driving circuit section 41. The remaining drive circuits 4, arranged along the long side of the substrate 1, constitute a source-driving circuit section 42.

In this embodiment, the gate-driving circuit section 41 is a gate shift register for the gate electrodes of the TFTs (later described) formed on the substrate 1, and the source-driving circuit section 42 is a source shift register for the source electrodes of the TFTs. The gate shift register and the source shift register are identical in structure. Only the gate shift register will be described, with reference to FIG. 5B.

As shown in FIG. 5B, the gate shift register comprises a plurality of shift register sections 4 which are shaped like islands and spaced apart from each other. Each shift register section 4 is formed on one polysilicon regions 21, and incorporating a plurality of switching elements (i.e., transistors). It is desirable that the switching elements (i.e., transistors) of each shift register be formed well within the polysilicon region 21, not reaching the edges thereof. Simultaneously with the switching elements, lines 40 are formed by the following method. First, an insulating film (e.g., a silicon oxide film) is formed on the polysilicon regions 21 and also on those portions of the amorphous silicon film 2 which are located among the polysilicon regions 21. Next, an aluminum or copper film is formed on the insulating film. Then, selective etching is effected on the aluminum or copper film, forming the lines 40, which connect any adjacent two of the shift register sections 4.

Then, as shown in FIG. 4C, TFTs (Thin Film Transistors) 5, which function as switching elements, are formed in the pixel region 50 by repeating film-forming and etching possesses, in the same number as pixels desired. The TFTs 5 are arranged in rows and columns in the pixel region 50. At the same time the TFTs 5 are thus formed, a film-forming process, a lithography process, and an etching process are performed, thereby forming gate and source bus lines 51 made of aluminum in the pixel region 50. As illustrated in FIG. 5B, these bus lines 51 are connected to the shift register sections 4.

It should be noted that the lines 40 may be formed at the same time as the gate and source bus lines 51, instead of simultaneously with the switching elements of the shift register sections 4. Conversely, the gate and source bus lines 51 may be formed, along with the liens 40, at the same time as the switching elements of the shift register sections 4. Furthermore, the lines 40 and 51 may be formed at the same time the TFTs 5 and the element electrodes of the drive circuit sections 4 and the TFTs 5 are simultaneously formed, or after the TFTs 5 and the element electrodes of the sections 4 have been formed simultaneously.

The semiconductor elements built in each drive circuit section 4 and the TFTs 5 formed on the pixel region 50 may be of variant structural configurations, such as planar type, reverse-stagger type, and the like. The semiconductor elements may assume such a structural configuration that their electrodes are located beneath the amorphous silicon film 2 or the polysilicon regions 21.

A transparent substrate (not shown) is bonded to the surface of the LCD substrate 10 thus formed. Liquid crystal is sealed in the gap between the substrate 10 and the transparent substrate, whereby an LCD panel is manufactured.

In the method explained with reference to FIGS. 4A to 4D, the TFTs 5 are formed after the drive circuit sections 4 have been fabricated. Instead, the TFTs 5 may be formed prior to the fabrication of the sections 4. Still alternatively, some of the sections 4 and some of TFTs 5 may be formed at the same time.

As indicated above, laser beam pulses are applied to the regions of the amorphous silicon film 2, shaped like islands and located along the two neighboring sides of the film 2, thereby converting these regions to polysilicon regions 21. The laser beam pulses have a cross section identical to each region in both size and shape. In addition, they have the same uniform and appropriate energy density. Hence, the regions irradiated with these beam pulses are converted into the polysilicon regions 21 which are uniform in crystallinity. Formed on these desirable polysilicon regions 21 by the repeated film-forming and etching processes, the semiconductor elements of the drive circuit sections 4 have good characteristics. In addition, the lines connecting the drive circuit sections 4 to each other and the lines connecting the sections 4 to the TFTs 5 can be formed at the same time the sections 4 are formed on the polysilicon regions 21 or the TFTs 5 are formed in the by using the pixel region 50. This helps to facilitate the manufacture of the LCD substrate 10.

In the method described above, the amorphous silicon film 2 is formed the light-transmitting substrate 1 by pressure-reduced CVD method. The film 2 may be formed by means of plasma CVD method, for example, by using monosilane gas and hydrogen gas in a reaction vessel held at a temperature of 180° to 300° C. and a pressured of 0.8 Torr. In this case, the amorphous silicon film 2 absorbs hydrogen and changes to an a-Si:H (hydrogenated amorphous silicon) film. Hydrogen may be released from the film when a laser beam is applied to the film to achieve laser annealing. Hydrogen may be abruptly released and damage the film. To minimize the damage to the film, the laser beam is applied in the following way.

In the first step, one or more laser beam pulses, each having energy much less than required to polycrystalline a-Si:H, are applied to a target region of the a-Si:H film. In the second step, one or more beam pulses, each having energy greater than any beam pulse first applied but less than required to polycrystalline a-Si:H, are applied to the target region of the amorphous silicon film. Hydrogen is thereby expelled from the a-Si:H film gradually. Then, in the third step, one beam pulse, for example, having energy greater than required to crystallize a-Si:H is applied to the target region of the film 2, thus converting the region to an polysilicon region 21. Thereafter, these steps are sequentially repeated on the other target regions of the a-Si:H film, thereby converting the regions to polysilicon regions 21. When two or more laser beam pulses are applied to a target region in the first or second step, it is desirable that the amount of hydrogen released from the film 2 be measured at the application of every beam pulse, and that a beam pulse having greater energy be applied to the target region if the amount of hydrogen released from the film 2 no longer changes noticeably.

In this method, laser beam pulses, each having greater energy than the preceding one, are sequentially applied to each target region of the a-Si:H film. Hence, hydrogen is released from the amorphous silicon film 2 step by step. Thus, hydrogen remains in the film 2, merely in so small an amount that it would not damage the film 2 even if all is released at a time.

A laser annealing apparatus equipped with a hydrogen amount monitoring device, used to perform the above-mentioned method of applying laser beam pulses, will be described, with reference to FIGS. 6, 7 and 8.

Figure 7:
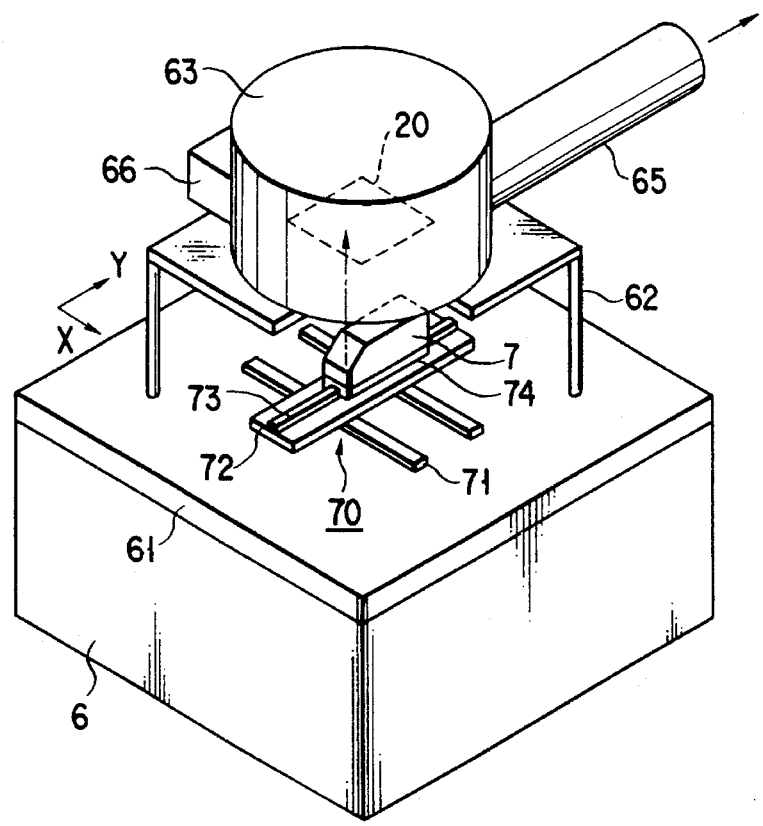
FIG. 7 is a perspective view showing the apparatus of FIG. 6.

FIGS. 6 and 7 diagrammatically show the laser annealing apparatus. As seen from these figures, the apparatus comprises a pneumatic support mechanism 6 which serves as base. The mechanism 6 has a support plate 61 made of rigid material such as metal. The support plate 61 is held by an air suspension; it is floating in a horizontal position, by virtue of controlled air pressure applied from below. A hollow support 62 is mounted on the support plate 61. Secured on the support 62 is a hollow cylindrical vacuum chamber 63 made of, for example, aluminum. The chamber 63 contains a heater plate 64, which is supported by vertical rods 64b extended from the top of the chamber 63. The support plate 64 includes an electric heater for heating the under surface of the plate 64 and arms 64a for supporting a glass substrate 20 with the amorphous silicon film facing downward on the under face of the plate 21.

The vacuum chamber 63 has an exhaust pipe 65 and gate valve G, and incorporate a mass spectrograph 66. The exhaust pipe 65 is coupled to a vacuum pump (not shown). The mass spectrograph 66 is used to measure the amount of hydrogen released from the amorphous silicon film on the substrate 20. The gate valve G is opened so that the substrate 20 may be removed from the chamber 63 and another substrate may be introduced thereinto. The valve G remains closed while the film on the substrate 20 is undergoing laser-beam pulse application. That portion of the bottom of the vacuum chamber 63, over which the heater plate 64 is mounted and which opposes the substrate 20 supported on the plate 64, is made of, for example, synthetic resin or quartz glass and, hence, serves as a window 67 for allowing the passage of a laser beam (later described).

As shown in FIGS. 6 and 7, a laser beam applicator 7 having a reflector 7a (see FIG. 8) is below the window 67. More precisely, the laser beam applicator 7 is supported by a mechanism 70 which is secured on the support plate 61 and located within the hollow support 62. The mechanism 70 is designed to move the applicator 7 in an XY horizontal plane. The mechanism 70 comprises a pair of rails 71 laid on the support plate 61 and extending in X-axis direction, an X-axis movable member 72 mounted on the rails 71 to move in the X-axis direction, a pair of rails 73 laid on the X-axis movable member 72 and extending in Y-axis direction, and a Y-axis movable member 74 mounted on the rails 73 to move in the Y-axis direction. It is on the Y-axis movable member 74 to which the laser beam applicator 7 is attached and fixed.

Figure 8:
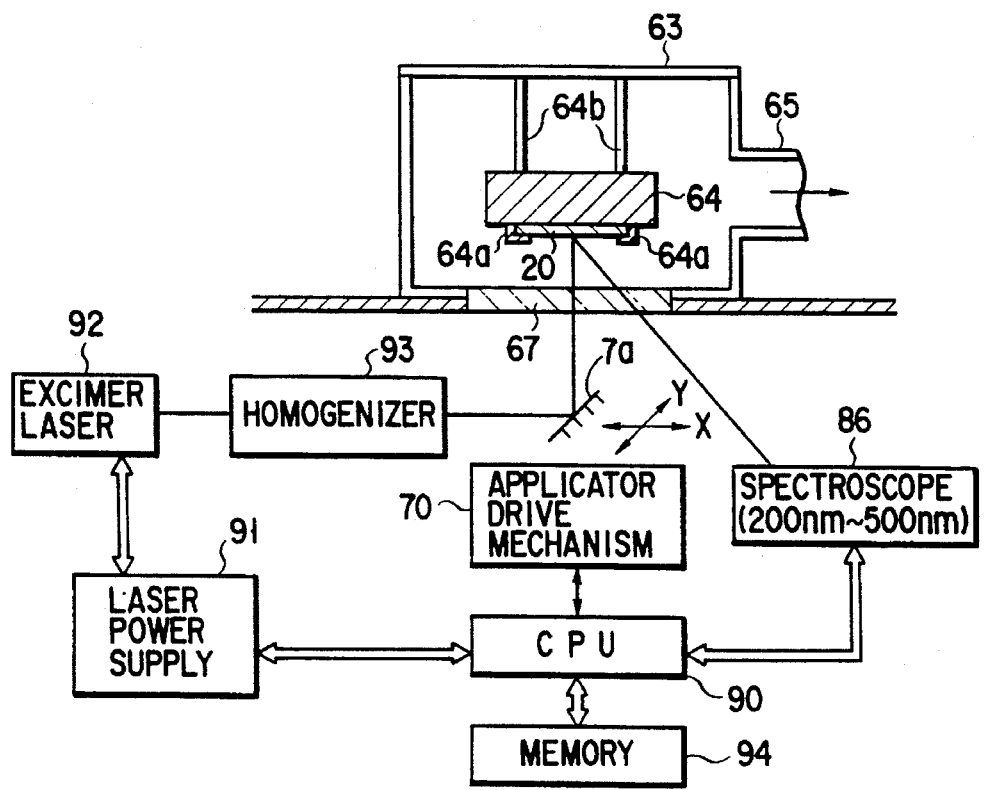
FIG. 8 is a block diagram illustrating the beam-emitting section and the crystal-evaluating section, both incorporated in the laser annealing apparatus.

As shown in FIG. 8, an excimer laser 92 is arranged by the side of the pneumatic support mechanism 6, with its beam-emitting tip directed to the reflector 7a of the laser beam applicator 7. A beam homogenizer 93 is located between the excimer laser 92 and the reflector 7a. The beam homogenizer 93 is designed to process the laser beam from the excimer laser 92, forming a beam which has a prescribed dimensions, and to apply this beam to the reflector 7a.

In this preferred embodiment, the excimer laser 92 is either a KrF laser which emits beam pulses having a wavelength of 248 nm and a width of 23 nsec, or an XeCl laser which emits beam pulses having a wavelength of 308 nm and a width of 25 nsec. The beam homogenizer 93 is of a known type; it comprises a beam-diverging member for diverging the incident laser beam and a fish-eye lens for focusing the diverged beam to a predetermined degree. The excimer laser 92 is connected to a laser power supply 91 and is driven by the electric power supplied from the power supply 91. The power supply 91 is controlled by a CPU 90. In other words, the CPU 90 controls the power supplied to the laser 92. Connected to the CPU 90 is a memory 94 which stores various data items for operating the laser annealing apparatus. Among these data items are: data for driving the mechanism 70; the data for controlling the laser power supply 91; and the data representing the reference distribution of band-gap spectral reflectance, based on which to evaluate the crystallized condition of a semiconductor film. As shown in FIG. 8, a spectroscope 86 is arranged outside the pneumatic support mechanism 6, for receiving the light reflected from the film on the substrate 20 and detecting therefrom the spectral characteristic of the silicon film formed on the substrate 20.

The method of operating the laser annealing apparatus will now be explained to crystallize the selected surface regions of the amorphous silicon film.

First, the gate valve G is opened. The substrate 20 is introduced through the valve G into the vacuum chamber 63 by a transport mechanism (not shown). The substrate 20 is placed on the under surface of the heater plate 64, with the amorphous silicon film facing downward. Next, the gate valve G is closed, and air is exhausted from the chamber 63 via the pipe 65 by means of the vacuum pump (not shown) until the inside pressure of the chamber 63 lowers to, for example, $2.5 \times 10^{-7}$ Torr. Thereafter, the CPU 90 controls the mechanism 70, which moves the laser beam applicator 7 intermittently in the horizontal plane or XY plane, that is, in the X-axis and Y-axis directions. Meanwhile, the CPU 90 controls the laser power supply 91, which supplies power to the excimer laser 92. The laser 92 emits beam pulses, one after another, to the beam homogenizer 93. The beam homogenizer 93 processes each incident beam pulse into a laser beam pulse having the prescribed dimensions. This laser beam pulse is supplied to the reflector 7a of the beam applicator 7. The reflector 7a reflects the beam pulse, applying the beam pulse upwards through the window 67 onto a target surface region of the the amorphous silicon film formed on the substrate 20. Irradiated with with beam pulse, the surface region of the amorphous silicon film converts into a polysilicon region 21.

The signal supplied from the CPU 90 to the power supply 91 has been set in accordance with the variant data items stored in the memory 94. These data items represent the periods for which to move and stop the mechanism 70 and the distance and direction in which to move the mechanism 70. Hence, the excimer laser 91 emits laser beam pulses, which ultimately irradiate island-shaped surface regions of the amorphous silicon film, which are spaced apart by a desired distance and have a predetermined size. The regions are, for example, square having a size of 0.65×0.65 cm=0.43 cm². The shape and size of each beam-irradiated region are determined by the specification of the beam homogenizer 93. Thus, polysilicon regions 21 of any dimensions desired, spaced apart by any distance selected and aligned in any direction can be formed by altering the data items in the memory 94 and by replacing the beam homogenizer 93 with another. Also, laser beam pulses of either the same energy or different energies can be applied onto the amorphous silicon film under the control of the CPU 90, as will be explained later.

To crystallize each target surface region of the amorphous silicon film by, for example, applying a single beam pulse, the beam applicator 7 applies a beam pulse having a width of 23 nsec to the first target region, and then applies another beam pulse of the same width after moved by the mechanism 70 for a predetermined distance, thereby applying the beam pulse onto the next target region spaced part by said distance. In this way, the island-shaped target regions arranged along the long and sort sides of the substrate 20 can be irradiated with beam pulses, as the CPU 90 controls the mechanism 70 and the laser power supply 91 in accordance with the various data items stored in the memory 94.

As has been indicated, it is desirable that laser beam pulses, each having energy greater than the preceding one, be sequentially applied to a target region of the amorphous silicon film if this film is an a-Si:H film formed on a glass substrate by means of plasma CVD method. To prove the advantage of this method of applying such beam pulses, the present inventors conducted experiments.

In the experiments, sets of beam pulses were applied to six target surface regions of an a-Si:H film having a thickness of 500 angstroms and placed in a vacuum chamber the inside pressure of which was 1.0×10⁻⁷ Torr, and other sets of beam pulses were applied to having six target surface regions of an a-Si:H film having a thickness of 300 angstroms and placed in a vacuum chamber the inside pressure of which was 2.0×10⁻⁷ Torr. In both cases, the beam pulses of each set had a cross section of 0.65 cm×0.65 cm=0.43 cm²; some of them were applied at frequency of 20 Hz, and the others at frequency of 10 Hz; they had different energies, each having energy greater than the applied immediately before, as is shown in Table 1. In this device the transmission factor of the members such as a window 67 is 75%. Also, in both cases, the substrate on which the a-Si:H film was formed was spaced apart from the laser beam source by a distance of 230 mm. As the beam pulses of each set were sequentially applied to the target region, the output current of the mass spectrograph 66 (corresponding to the amount of hydrogen released from the a-Si:H film) was measured and recorded.

TABLE 1

|  | S1 | S2 | S3 | S4 | S5 |
|---|---|---|---|---|---|
| Beam energy 20 Hz (mj) | 80 | 80 | 80 | 80 | 80 |
|  | 120 | 120 | 120 | 120 | 120 |
|  | 160 | 160 | 160 | 160 | 160 |
|  | 200 | 200 | 200 | 200 | 200 |
| Beam energy 10 Hz (mj) | 240 | 240 | 240 | 240 | 240 |
|  | 280 | 280 | 280 | 280 |  |
|  | 320 | 320 | 320 | 320 |  |
|  | 360 | 360 | 360 |  |  |
|  | 400 | 400 |  |  |  |
|  | 430 |  |  |  |  |
|  | 450 |  |  |  |  |

In this case, a relationship between the laser energy (mj) E and the (laser energy)/(power density (mj/cm²)) E/P is as follows

| E | 80 | 120 | 160 | 200 | 240 | 280 | 320 | 360 |
|---|---|---|---|---|---|---|---|---|
| E/P | 140 | 209 | 279 | 349 | 419 | 488 | 558 | 628 |

| E | 400 | 430 | 450 |
|---|---|---|---|
| E/P | 698 | 750 | 785 |

Figure 10:
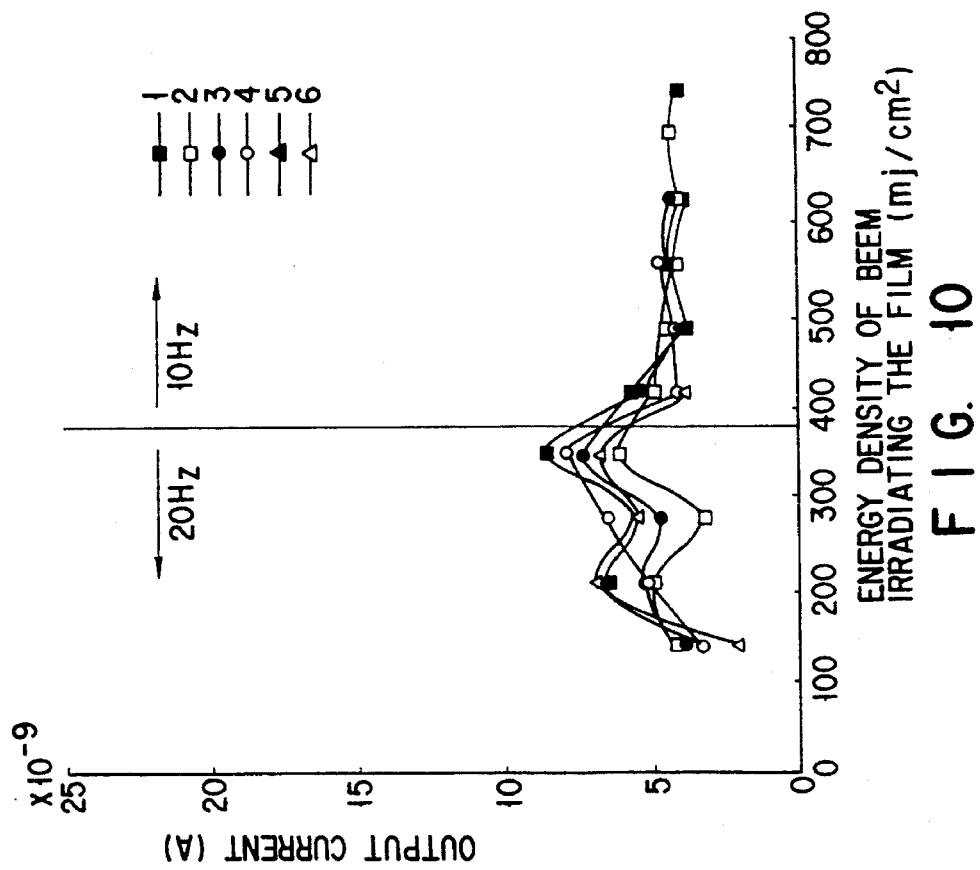
FIG. 10 is another graph illustrating the relationship between the amount of hydrogen released from an a-Si:H film having a thickness of 300 angstroms and the energy density of the laser beams irradiating this film.
Figure 9:
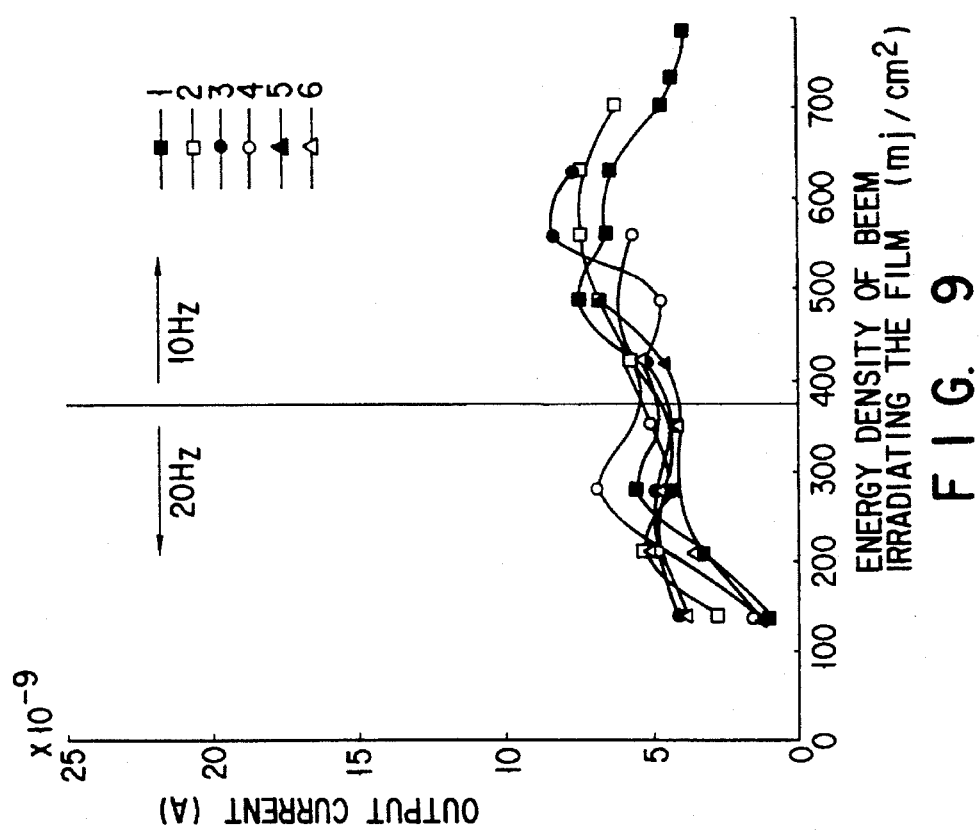
FIG. 9 is a graph representing the relationship between the amount of hydrogen released from an a-Si:H film having a thickness 500 angstroms and the energy density of the laser beams irradiating this film.

The results obtained of an a-Si:H film having a thickness of 500 angstroms were as is illustrated in FIG. 9, and the results obtained of an a-Si:H film having a thickness of 300 angstroms were as is shown in FIG. 10. In FIGS. 9 and 10, the output current of the mass spectrograph 66 and the energy density of the laser beams irradiating each target region of the a-Si:H film are plotted on the ordinate and abscissa, respectively.

As is evident from FIGS. 9 and 10, the amount of hydrogen released from either a-Si:H film did not abruptly increased, whereby the film was prevented from being damaged. This is because each target region of either a-Si:H film was irradiated with several laser beam pulses which were sequentially applied, each having energy greater than the preceding one.

According the present invention, it is useful to sequentially apply laser beam pulses of the substantially same energy to one target region of an amorphous silicon film, instead of beam pulses having different energies. The energy of each beam pulse is great enough to melt a-Si. The more beam pulses are applied onto the target region, the larger the a-Si grains grown, and the more orientated the grains become. Thus, a-Si becomes similar to a single-crystal silicon having a (111) face. In this case, since the a-Si is melted by a laser of 20 to 30 nsec a heat is not transmitted to the substrate. As a result, the field-effect mobility of the amorphous silicon therefore becomes higher than that of polycrystalline silicon. When this method of applying beam pulses of the same energy should better be employed when the following conditions are satisfied:

1. The amorphous silicon film is 300 to 1500 Å thick, more preferably 500 to 1000 Å thick. Unless the film has a thickness outside this range, the grains can hardly orientated.

2. The substrate remains at normal temperature to 550° C. during the application of beam pulses. The cheap soda-glass substrate may be distorted.

3. 30 to 1000 shots of a laser beam are applied to each target region. If the region is irradiated less than 30 times, it will not be effectively converted to single-crystalsilicon. If the region is irradiated more than 1000 times, much time will be required to convert the region to single-crystalsilicon, and the resultant polysilicon region will more likely to defects.

Figure 11A:
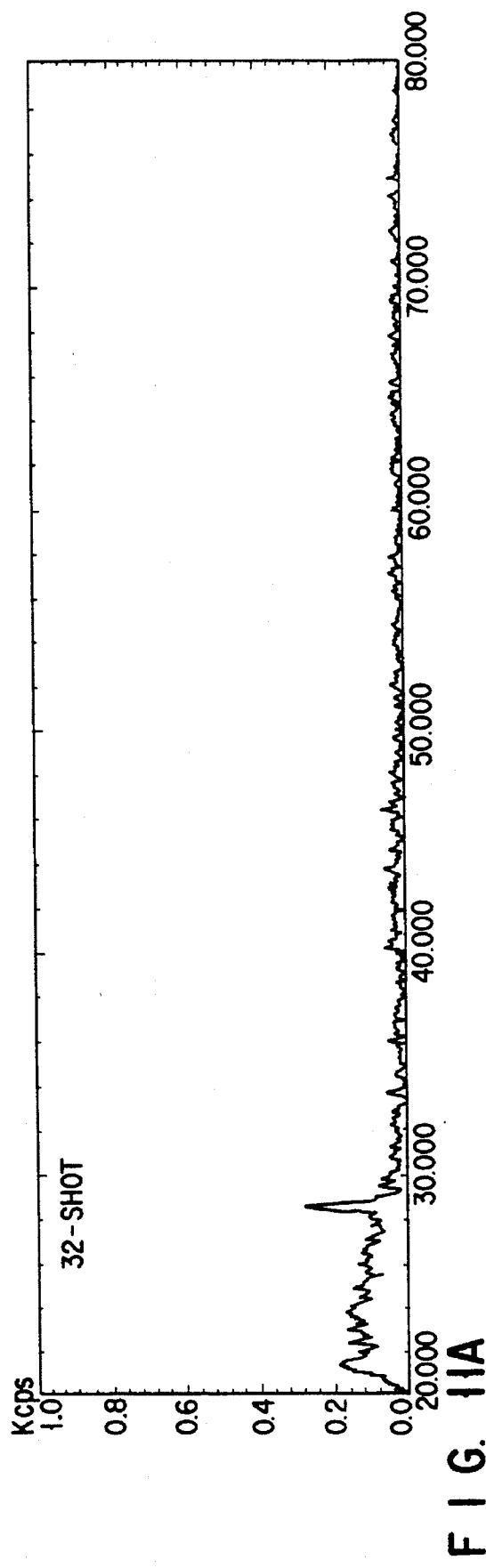
FIGS. 11A, 11B and 11C are diagrams showing the distributions of integrated irradiation intensity which were measured when 32 shots, 128 shots an 1024 shots of a laser beam were applied to an amorphous silicon film.
Figure 11B:
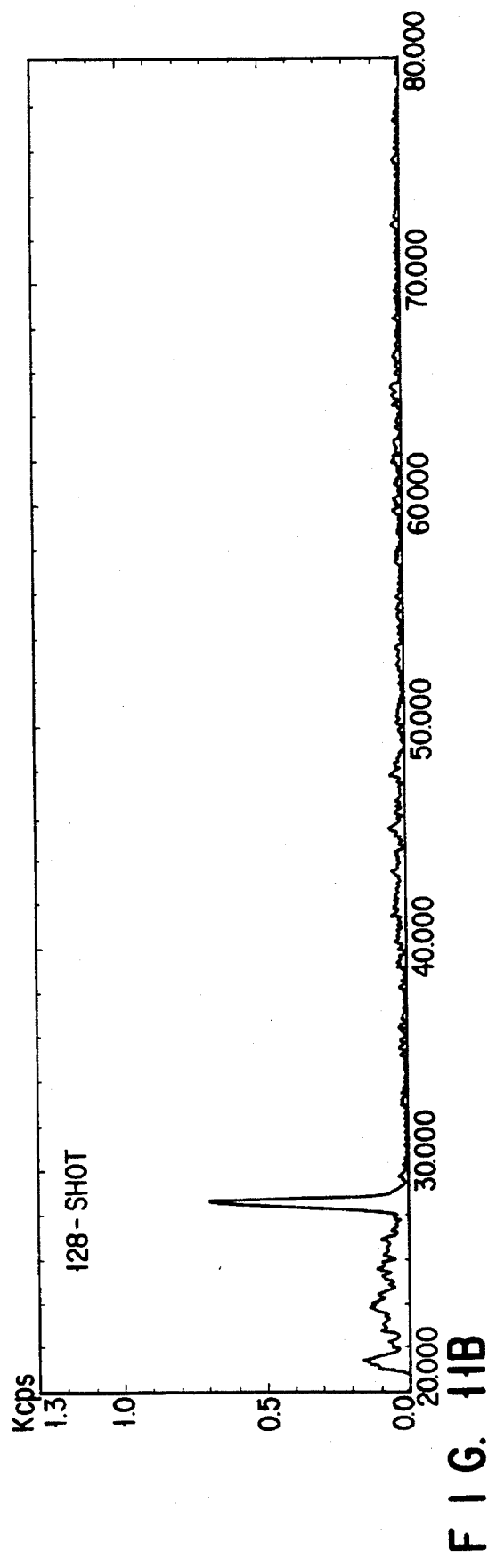
Figure 11C:
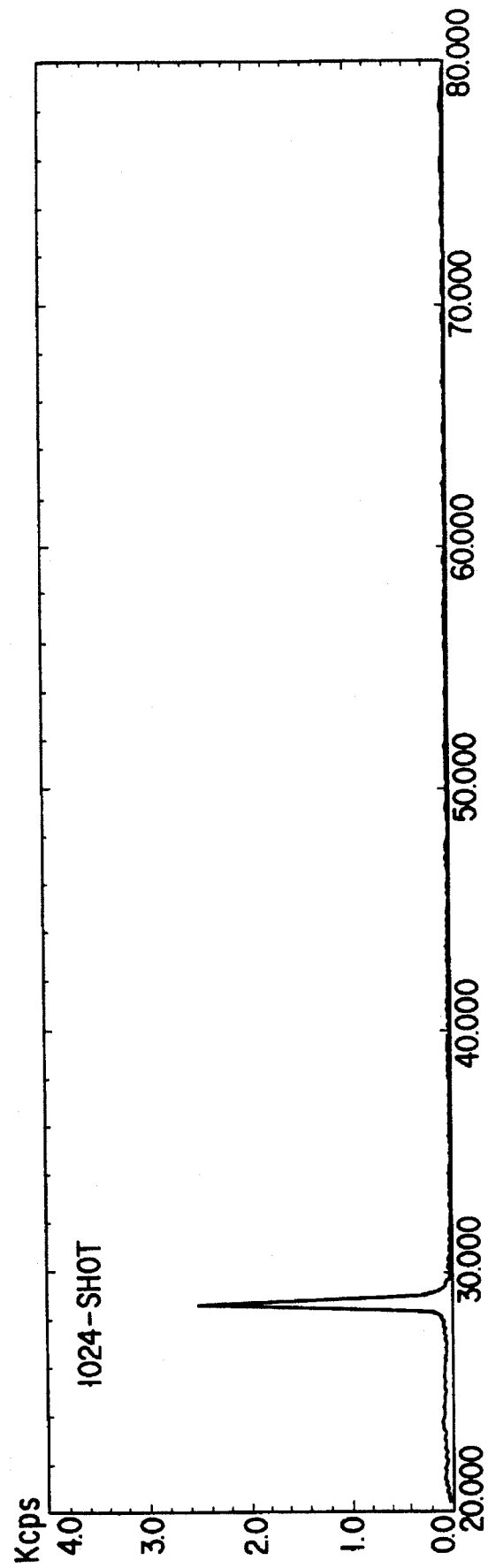

FIGS. 11A, 11B and 11C show the distributions of irradiation intensity which were measured by a goniometer, means of a 2θ/θ method with an X.R.D. (X-ray diffraction), when 32 shots, 128 shots an 1024 shots of a laser beam were applied from the aforementioned laser (laser energy of 180 mj; power density of 272 mj/cm$^2$) to an amorphous silicon (a-Si:H) film formed by a plasma CVD method, having a thickness of 700 Å and held at temperature of 400° C. As may be understood from FIGS. 11A, 11B and 11C, when 32 shots of a laser beam were applied to the film, the irradiation intensity reached its peak at the position of 28.632°. This peak value is not so greater than the irradiation intensities at other positions. Nonetheless, as is evident from FIGS. 11B and 11C and as is well known in the art, the more shots of a laser beam are applied, the greater the peak value at the position of 28.632°. In other words, the more times the film is irradiated with a laser beam pulse, the more similar to single-crystalsilicon having (1,1,1,) face which generally has an intensity peak at 28.632°, it will become.

How to convert the amorphous silicon to polysilicon and how to evaluate the crystallized condition of the resultant silicon crystal will be described, with reference to FIG. 8 through FIG. 12.

As shown in the flow chart of FIG. 12, in Step S1, the laser power supply 91 is turned on by a command the CUP 92 has generated in accordance with the control program stored in the memory 94. The excimer laser 92 is thereby driven, emitting a laser beam. The laser beam travels to the reflector 7a of the applicator 7 through the beam homogenizer 93. The reflector 7a reflects the beam onto a target surface region of the amorphous silicon film, whereby the laser beam anneals that target region.

Then, in Step S2, the spectroscope 86 detects the laser beam reflected from the target region, and determines the distribution of band-gap spectral reflectance of the target region which has been crystallized to at least some extent. Next, in Step S3 it is determined whether or not the target region has acquired desirable crystallinity. More precisely, the distribution of the band-gap spectral reflectance of the target region is compared with the reference distribution of band-gap spectral reflectance, which pertains to a semiconductor material having desired crystallinity and which is stored in the memory 94. The more similar the spectral reflectance distribution to the reference distribution, the more the region has been annealed with the laser beam.

If No in Step S3, that is, if the target region has not acquired desired crystallinity yet, the flow goes to Step S4. In Step S4, the CPU 90 generates a command, thereby increasing the irradiation energy by a predetermined value. The irradiation energy can be increased so by changing the output of the excimer laser 92, by altering the intervals of applying laser beams (in the case of spot irradiation), by adjusting the speed of the mechanism 70, or by any possible combination of these methods. The flow then returns to Step S1, and Steps S1, S2, S3 and S4 are repeated until it is determined in Step S3 that the target region has acquired desired crystallinity.

If Yes in Step S3, that is, if the target region has acquired desired crystallinity, the flow goes to Step S5. In Step S5, the mechanism 70 is driven to move the beam applicator 71, whereby a laser beam is applied to the next target region. Then, in Step S6 it is determined whether or not all target regions of the amorphous silicon film have been irradiated with laser beams and thereby annealed. If No, the flow returns to Step S1, whereby Steps 1 to S6 are repeated until all target regions are annealed with laser beams. If Yes in Step S6, then application of laser beams is terminated.

By virtue of the above-mentioned method of evaluating the crystallized condition of an amorphous silicon film, it is possible the method of manufacturing an LCD substrate and the apparatus for forming thin polysilicon films, both according to the present invention, to evaluate the crystallize condition of the amorphous silicon film being crystallized with a laser beam, on the basis of the distribution of spectral reflectance of the film, not by using special and expensive devices such as a Raman spectroscope. Therefore, the energy of the laser beam can be feedback-controlled in real time, and laser annealing can therefore be easily performed at low cost, thereby to manufacture a TFT-LCD substrate with high yield and great throughput.

After all target region of the amorphous silicon film have been annealed with laser beams, the inside pressure of the vacuum chamber 63 is changed back to the atmospheric pressure. The gate valve G is opened, and the substrate 20 is removed from the chamber 63 by means of a transport mechanism (not shown). Then, the substrate 20 is transported to various processing stations (e.g., a film-forming station, a lithography station) one after another. At these stations, TFTs are formed in the pixel region 50 of the substrate 20 by using masks of specific patterns, and the switching elements of the drive circuit section 4 are formed in the edge portions of the substrate 20 by using masks of specific patterns, simultaneously and integrally with the TFTs. At the same time, there are formed scanning electrode lines, which connect the pixel units and drive circuit sections 4. Therefore, independent steps need not be performed to mount LSI chips for sections 4 or forming the scanning electrode lines as in the conventional method of manufacturing an LCD substrate.

The distribution of band-gap spectral reflectance used to evaluate the crystallized condition of any amorphous silicon film being crystallized will be explained.

As is well known in the art, the energy band of silicon crystal has the configuration illustrated in FIG. 13. It has a width of about 3.43 eV at point Γ and a width of about 4.40 eV at point X. A laser beam having energy of, for example, 400 mj and a square cross section of 0.43 cm$^2$ (=0.65×–0.65 cm) was applied through a window having a transmittance of 75% to a reference semiconductor crystal which had the energy band shown in FIG. 13 and a thickness of 500 angstroms. As a result, a distribution of band-gas spectral reflectance was obtained which is illustrate in FIG. 14. As shown in FIG. 14, this distribution have two peak values in the vicinity of 284 nm and 364 nm. These peak values correspond to X point and Γ point, respectively, which are two of the special points in the first Brillouin zone.

On the other hand, amorphous silicon has such a distribution of band-gap spectral reflectance of amorphous silicon as is illustrated in FIG. 15. As is seen from FIG. 15, the profile of this distribution quite differs from that of the distribution shown in FIG. 14; it is very specific to the amorphous silicon. The reflectance distribution of FIG. 15 gradually changes toward the one shown in FIG. 14 as the amorphous silicon is laser-annealed to become polycrystalline silicon. In the present invention, the comparator (not shown) incorporated in the spectroscope 86 compares the reflectance distribution detected by the spectroscope 86, with the reference distribution of FIG. 14 stored in the memory 94. It is thereby determined in real time how much the amorphous silicon has been crystallized thus far.

when the laser beam applied from the excimer laser 92 to the amorphous silicon film on the substrate 20 has energy of, for example, 200 mj, which is less than required to crystallize amorphous silicon, the distribution of band-gap spectral reflectance will have a profile sloping generally downwards to the right as shown in FIG. 16, having no conspicuous peaks. In contrast, when the laser beam applied from the laser 92 to the amorphous silicon film has energy of, for example, 600 mj, which is too great to achieve ideal crystallization of amorphous silicon, the distribution of band-gap spectral reflectance will have a profile sloping generally upward to the right as shown in FIG. 17. The distribution profile of FIG. 17 indicates that the film has been damaged, with silicon oxide formed in its surface region.

When the spectral reflectance distribution of the type shown in FIG. 16 is detected, the energy of the laser beam is gradually increased by real-time feedback control, thereby changing the distribution toward the reference spectral reflectance distribution of FIG. 14. when the spectral reflectance distribution becomes very similar to that one shown in FIG. 14, the laser-beam application is stopped, thus preventing damages to the film. If the spectroscope 86 detects a spectral reflectance distribution similar to the one shown in FIG. 17, then it is determined that the film has been damaged, and substrate 20 is discarded as a defective product.

It is desirable that, as described above, the energy of the laser beam is gradually increased by real-time feedback control so that the distribution of FIG. 16 may change toward the reference spectral reflectance distribution of FIG. 14. Were the energy of the beam increased abruptly to an unnecessarily great value, the hydrogen would be released at a time from the amorphous silicon film, inevitably damaging the silicon film and ultimately rendering the substrate 20 defective.

Because of the nature of the actually employed method of analyzing the distribution of spectral reflectance, the detected distribution of spectral reflectance of the film cannot be completely identical to the reference distribution (FIG. 14). Hence, the film is considered to have been appropriately crystallized, when the difference between the actually detected distribution and the reference distribution reduces to a predetermined value. For instance, the peaks moment two peak values appear points within 20 nm off X point (about 284 nm) and Γ point (about 364 nm), the film is regarded as just having been crystallized to a desired degree. Alternatively, techniques known in the field of pattern recognition may be utilized to compare the profile of the actually detected distribution with that of the reference distribution profile (FIG. 14), and the film may be considered to have been crystallized appropriately at the time the dissimilarity between the compare profile reduces to a prescribed value.

With the method described above it is possible to evaluate the crystallized condition of an amorphous silicon film, without using special and expensive devices. Therefore, the amorphous silicon can be analyzed as to how it has been crystallized, in real time and at low cost.

By virtue of the above-mentioned method of evaluating the crystallized condition of an amorphous silicon film, it is possible the method of manufacturing an LCD substrate and the apparatus for forming thin polysilicon films, both according to the present invention, to evaluate the crystallize condition of the amorphous silicon film being crystallized with a laser beam, very easily at low cost and in real time. Based on the crystallized condition thus evaluated, the energy of the laser beam can be feedback-controlled in real time, whereby LCD substrates can be manufactured with high yield and, hence, with great throughput.

Figure 18A:
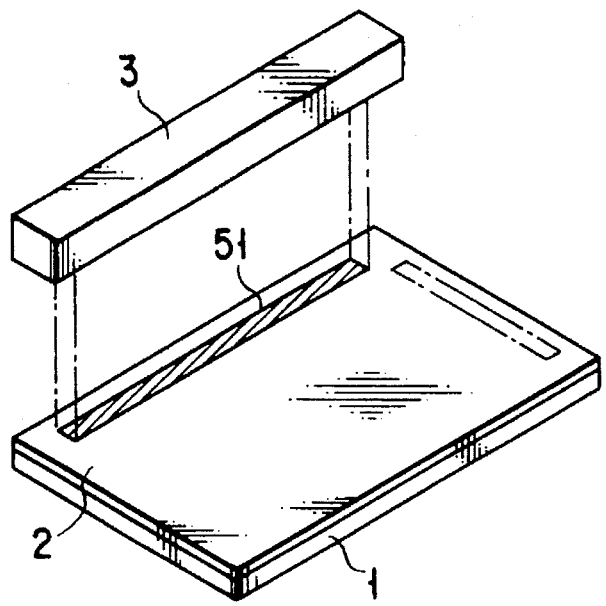
FIGS. 18A and 18B are views for respectively showing laser-irradiated regions.

According to the present invention, the method of applying a laser beam to an amorphous silicon film is not limited to the one described above. An alternative method may be employed, wherein an laser beam applicator applies laser beam pulses of a particular energy to the respective target regions of the amorphous silicon film, then beam pulses of a slightly greater energy to the target regions, next beam pulses of still slightly greater energy to the target regions, and so forth. Another alternative method may be performed, in which a laser beam applicator simultaneously applies two or more laser beams, spaced apart from one another, to the respective target regions of the amorphous silicon film. Still another alternative method may be used, wherein, as shown in FIG. 18A, a laser beam applicator 3 applies to an amorphous silicon film 2 a single laser beam having a rectangular cross section which has a size of millimeters by about 100 millimeters. Furthermore, a fourth alternative method may be employed, wherein, as shown in FIG. 18B, a laser beam applicator 3 applies to an amorphous silicon film 2 a single laser beam having an L-shaped cross section which has a size of millimeters by about 100 millimeters.

As may be understood from the preceding paragraph, a laser beam or beams can be applied in various ways, to thereby form a plurality of polysilicon regions or a single polysilicon region, and any desirable size and shape can be selected for each region merely by using a beam applicator designed to apply laser beams having a cross section of that size and shape.

Figure 18B:
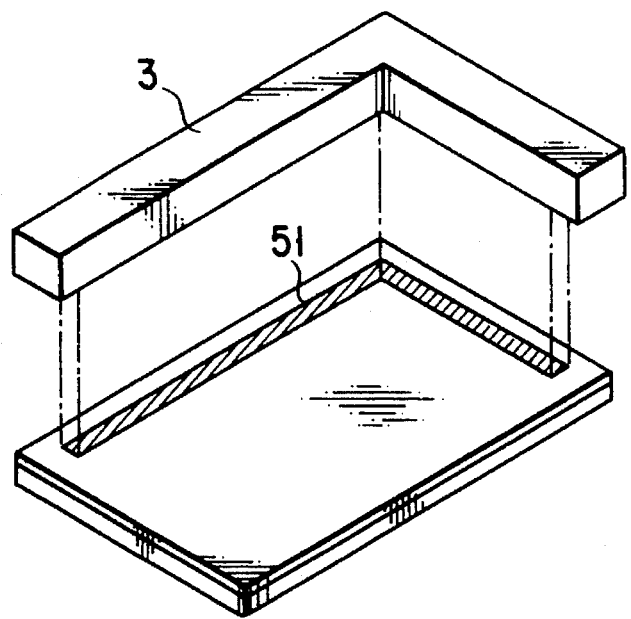

Once a single polysilicon region 51 has been formed by the method of FIGS. 18A or 18B, all drive circuit sections (e.g., gate drivers and source drivers) of the LC substrate can easily be formed on the polysilicon region. Moreover, the beam applicator for use in the method of FIGS. 18A or 18B is easy to design. In addition, the region 51 can easily be aligned with lithography mask patterns for forming the drive circuit sections, ultimately increasing the throughput. Therefore, the methods of FIGS. 18A and 18B are advantageous.

A system for mass-producing the LCD substrate, which incorporates the laser annealing apparatus shown in FIGS. 6 and 7, will be described with reference to FIG. 19 which is a top view of the system.

Figure 19:
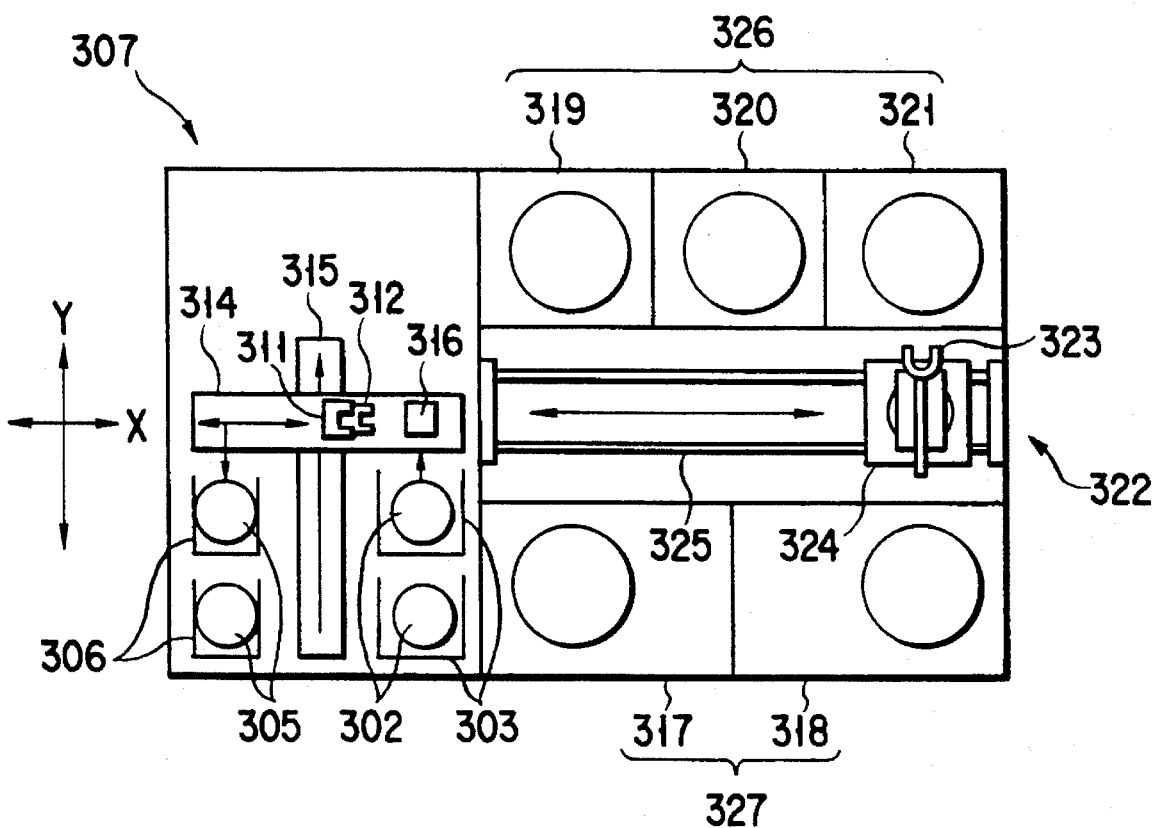
FIG. 19 is a top view for schematically showing a system for mass-producing LCD substrates.

The system shown in FIG. 19 comprises various devices and is designed to perform a sequence of film-forming processes for manufacturing the LCD substrate. More specifically, the system comprises a loading section, an unloading section and a transport unit.

The loading section receives and holds a plurality of cassettes 303, each containing a prescribed number (e.g., 25) of substrates (or glass substrates) 302. which are to be subjected to any process. The substrates 302 are positioned horizontally in each cassette 303.

The unloading section receives and holds a plurality of cassettes 306, each containing a prescribed number (e.g., 25) of substrates 305 which have been processed in any process by the various devices. The substrates 305 are positioned horizontally in each cassette.

The transport unit is located between the loading section, the unloading section and a processing zone (various devices), for transporting the substrates 302 from the cassettes 303 to a processing zone and transporting the processed substrates 305 from the zone into the cassette 306. It is in the processing zone that the devices are arranged to perform film-forming process and annealing process.

The loading section, the unloading section and the transport unit define a cassette zone 307.

The transport unit comprises a transport arm section which has an upper transport arm 311 and a lower transport arm 312. The arm 311 is used to transport the substrate 302 to be processed from the cassettes 303. The arm 312 is used to transport the substrates 305 after processed into the cassettes 306.

The transport unit is mounted on an X-stage 314 which can rotate around a Z axis and move along a straight line, or an X axis, between the processing zone and the cassette zone. The X-stage 314 is mounted on a Y-stage 315 which can move along a straight line, or a Y axis, between the loading cassettes 303 and the unloading cassettes 306. The transport arm section can therefore transport the substrates 302 and 303 between the processing zone and the cassette zone.

Positioning means 316 is mounted on the X-stage 314, for aligning the substrates 302 in appropriate positions with respect to the processing zone especially setting the position at substrates for processing devices.

The processing zone will be described in detail. Arranged in this zone are processing devices 317, 318, 319, 320 and 321 and a common transport unit 322. The devices 319, 320 and 321 form a first group 326, and the devices 317 and 318 constitute a second group 327. Between the groups 326 and 327 a common transport path 325 extends along the X axis. The common transport unit 322 has a transport arm 323. The transport arm 323 is mounted on a stage 324. The stage 324 can move along the common transport path 325, toward and away from the positioning means 316 located in the cassette zone. The arm 323 can therefore move along the X axis. Furthermore, the arm 323 can rotate around a Z axis perpendicular to the XY plane defined by the X and Y axes and move along the Y axis. Thus, the transport arm 323 can transport the substrates 302 from the positioning means 316 to any one of the processing devices 317 to 321, and to transport the substrates 305 from any processing device to the positioning means 316.

The best possible examples of the transport arm section and the common transport unit 322 are disclosed in U.S. patent application Ser. No. 834,819, entitled "Transportation-Transfer Device for an Object of Treatment," filed by Kenji Yokomizo and Yuji Yoshimoto. Also, preferred examples of the section and unit 322 are disclosed in U.S. Pat. No. 4,985,722 to Ushijima et al., entitled "Apparatus for Coating a Photo-Resist Film and/or Developing It after Being Exposed."

The operation of the LCD substrate manufacturing system shown in FIG. 19 will be explained in the following.

The transport arm section and the common transport unit 322, located in the cassette zone and the processing zone, respectively, cooperate to transport the substrates 302 and 305 in the atmosphere or an atmosphere of non-oxidizing gas such as $N_2$, either at a positive pressure more than the pressure of atmosphere. Since the substrates 302 and 305 are transported in an atmosphere at a pressure equal to or hither than the atmospheric pressure, they can be held steadfastly by means of vacuum suction and can, hence, be transported at high speed without being displaced noticeably.

If the substrates 302 and 305 are transported in an $N_2$ atmosphere, any film formed on them remain unchanged in property and is not covered with a naturally formed oxide film, either before or after a film-forming process or laser annealing. Thus, no step of removing a naturally formed oxide film needs to be added to the method of manufacturing the LCD substrate. If the substrates 302 and 305 are transported in the atmosphere, evacuation needs not be effected as would be required if they were transported in a vacuum. Hence, the process which any one of the devices 317 to 321 performs is not interrupted by such evacuation, and idling time, if any, is very short.

Each substrate, transported in the atmosphere or the $N_2$ atmosphere into one the processing devices 317 to 321, may be processed therein in vacuum. If this is the case, the device has a load lock chamber and a processing chamber which are connected together and arranged along the Y-axis. Preferred examples of these chambers are disclosed in U.S. patent application Ser. No. 889,409, entitled "Semiconductor Manufacturing Apparatus," filed by Hiromi Kumagai.

As shown in FIG. 19, the processing devices 317 to 321 are arranged dual in line, in two rows on the sides of the common transport unit 322 so that those of the first row oppose those of the second row. Each substrate can therefore be efficiently transported from one device to another in any desired order, whereby a plurality of processes are performed on each substrate in a desired sequence. Alternatively, a plurality of substrates can be subjected to the same process by the respectively devices at the same time.

The system of FIG. 19 is advantageous in some respects over such clustered apparatuses as disclosed in U.S. Pat. No. 4,785,965 (Masato Toshima, entitled "Vacuum Chamber Slit Valve"), U.S. Pat. No. 5,186,594 (Toshima et al., entitled "Dual Cassette Load Lock") and U.S. Pat. No. 5,186,718 (Tepman et al., entitled "Staged-Vacuum Wafer Processing System and Method"), in that substrates can be transported slower and are less liable to displace since they are not held by vacuum suction. This is because, the common transport unit 322 is placed either in the atmosphere or in the $N_2$ atmosphere at a pressure higher than the atmospheric pressure and can be used with vaccum chuck, whereas in the clustered apparatus the cluster tools are located around the common transport unit which is placed in a vaccum. Without a vacuum section unit whatever, the system shown in FIG. 19 can be placed on market at a low price.

As indicated above, the processing devices 317 to 321 are arranged, dual in line—that is, in two rows on the sides of the common transport unit 322. Thus, if addition processes should be conducted on each substrate, or if more substrates should be processed simultaneously, then additional processing devices can easily be arranged on the either side of the common transport unit 322. Due to said specific arrangement of the devices 317 to 321, too, it is possible to subject each substrate to a desired sequence of processes selected— merely by altering the rout in which to transport the substrate.

It will be explained how the system of FIG. 19, described above, form a film on a substrate and performs laser annealing on the film.

First, the transport arm section takes out a substrate made of soda glass and having a clean surface from a cassette 303 located in the loading section and then places it on the positioning mean 316. The positioning means 316 positions the substrate 302 properly with respect to the processing zone. Then, the common transport unit 322 transports the substrate into the processing device 319. The device 319 heats the substrate to, for example 350° C. to 400° C. which is close to the temperature 600° C. of forming an amorphous silicon film on the substrate in the next process. This helps to start the film-forming process immediately and to form an amorphous silicon film which is of high quality, having as little defect in an LCD substrate as possible.

Next, the the common transport unit 322 removes the substrate from the processing device 319 and transports it into the processing device 320. More precisely, the substrate is inserted into the processing chamber of the device 320. The processing chamber is evacuated at a predetermined degree of vaccum and filled with a predetermined process gas and then plasma is generated by RF. In the chamber, the substrate is heated to about 600° C., whereby an amorphous silicon film is formed on the substrate, to a thickness of about 300 to 1500 Å.

Then, the common transport unit 322 removes the substrate from the processing device 320 and inserts it into the processing device 321. In the device 321, the substrate is cooled to a temperature of 400° C. or less. The unit 322 removes the substrate from the processing device 321 and transports it into the processing device 318. In the device 318, a laser annealing device applies a laser beam 30 to 1000 times onto each of target regions of the amorphous silicon film on the substrate, as described above. As a result, the target regions of the amorphous silicon film change into island-shaped polysilicon regions.

Thereafter, the common transport unit 322 removes the substrate from the processing device 318 and transports it into the processing device 317. In the device 317, the substrate is cooled to 100° C. or a lower temperature so that it may be inserted into a cassette 306. Then, the common transport unit 322 removes the substrate from the device 317 and mounts it onto the positioning means 316. The transport arm section transports the substrate into the cassette 306 located in the unloading section. Thus, the substrate processed in a sequence of steps is now contained in the cassette 306.

The device incorporated in the system described above and designed to provide a non-oxidizing atmosphere, e.g., an $N_2$ atmosphere, will be described with reference to FIG. 20.

Figure 20:
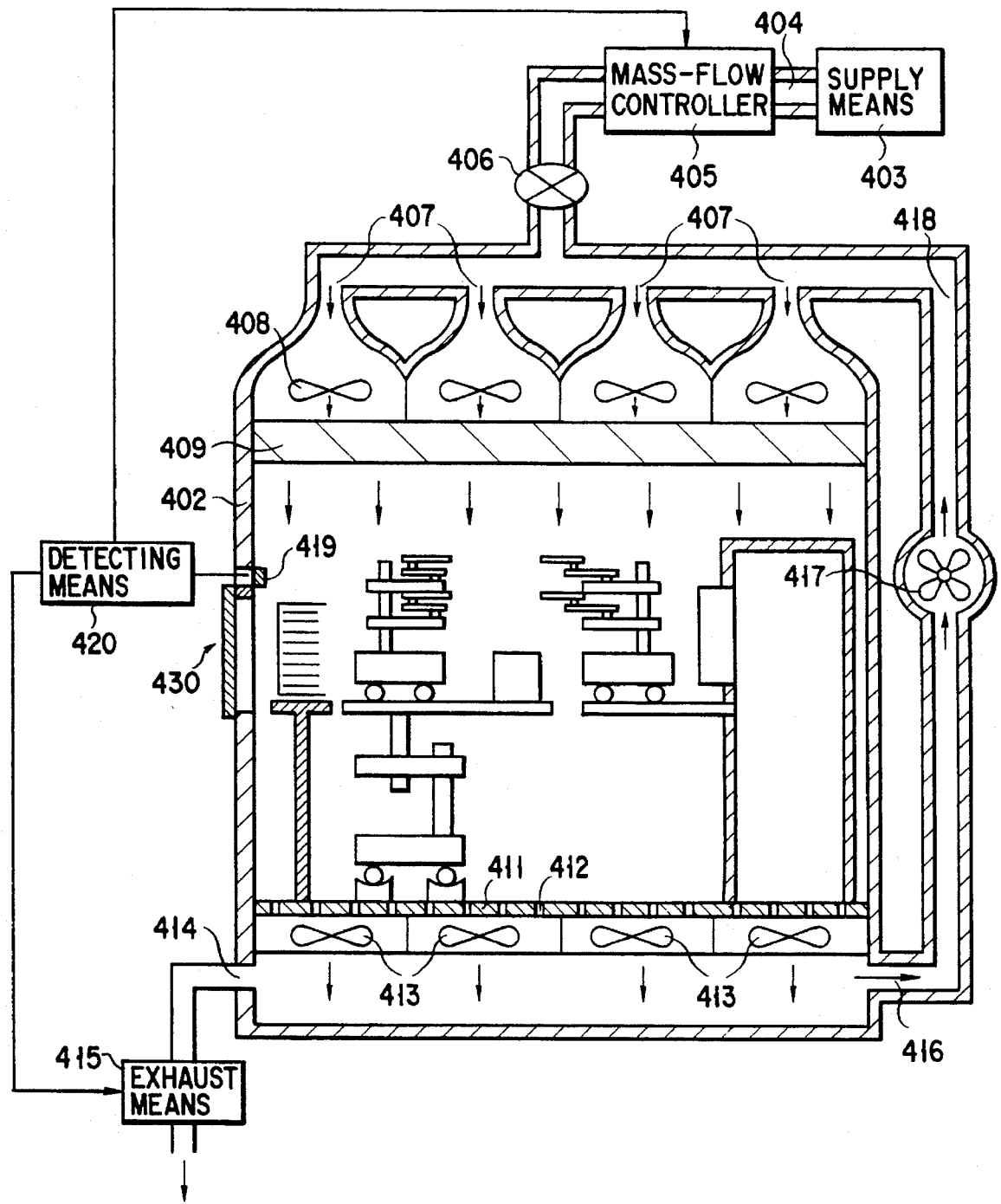
FIG. 20 is a view for showing a housing for receiving the system shown in FIG. 19 and a system for controlling the inside condition of the housing.

As shown in FIG. 20, a housing 402 is installed in a clean room. The housing 402 defines a space. Arranged in this space are: the cassettes 306 containing processed substrates 305; the transport arm section; the positioning means 316; the common transport unit 322; the common transport path 325; and the processing devices 317 to 321.

Outside the housing 402 there is provided a non-oxidizing gas source, for example, an $N_2$ gas source or gas supply means 403. $N_2$ gas is supplied from the source 403 via pipes 404 to a mass-flow controller 405. The mass-flow controller 405 supplies the gas at a predetermined rate through a valve 406 to a plurality of gas-supplying ports 407 which open in the space of the housing 402. Fans 408 are located in the gas-supplying ports 407, each in one port 407. When driven, the fans 408 cause the $N_2$ gas to flow downward through a filter 409, whereby a plurality of vertical gas streams shown by arrows flow downward in the space. The position of the filter 409 may be located above the fans 408, to thereby form the vertical gas streams after the $N_2$ gas has passed through the filter 409.

The floor 411 at the bottom of said housing 402, has a grading configuration, having a number of openings 412. Beneath the floor 411 there are located a plurality of fans 413, which draw the $N_2$ gas out of the space of the housing 402. Part of the $N_2$ gas drawn from the space is exhausted from the system via an exhaust port 414 by means of an exhaust means 415. The remaining part of the $N_2$ gas is supplied upward via a circulating gas inlet 416 and a pipe 418 back into the gas-supplying ports 407. More precisely, the $N_2$ gas is driven into the ports 407 by a fan 417 arranged in the pipe 418.

The pressure in the space of the housing 402 is detected by a pressure-detecting means 419 attached on the inside of the housing 402 and communicating with the space. The output of the means 419, which represents the pressure in the housing, is supplied to a pressure controller (pressure detecting means) 420. The controller 420 compares the pressure in the space with a preset pressure which is higher than, for example, the atmospheric pressure and generates a signal showing the difference between the pressures compared. The signal is supplied to both the mass-flow controller 405 and the exhaust means 415. In accordance with the magnitude of the signal, the controller 405 adjusts the flow rate of the $N_2$ gas, and the exhaust means 415 changes the rate at which the gas is exhausted from the space through the exhaust port 414.

The housing 402 has a cassette loading/unloading door 430. While the door 430 remains open, the cassettes can be transported into and from the housing 402 and as the inside of the housing 402 has a higher pressure comparing with the outside, $N_2$ gas flows from the inside to the outside so as to prevent the contamination in the housing 402. While the door 430 remains closed, the pressure in the space is held higher than the atmospheric pressure, and air cannot flow into the housing 402 from outside.

$N_2$ gas is preferable as non-oxidizing gas for two reasons. First, it can be produced at a lower cost than any other non-oxidizing gas. Second, it more readily prevents the surface of an LCD substrate from being oxidized or changing in property, making it possible to form a high-quality semiconductor film on the LCD substrate. Thanks to the use of $N_2$ gas, no step of removing a naturally formed oxide film needs to be added to the method of manufacturing the LCD substrate, and the LCD substrate can be manufactured at low cost.

According to the present invention, the semiconductor elements for supplying a current to the pixel electrodes are not limited to TFTs; there may be semiconductor elements of any other types. Furthermore, the semiconductor elements may be formed on a crystallized surface region of the amorphous semiconductor film.

In the present invention, as has been described, laser beam pulses are applied to the island-shaped target regions of an amorphous semiconductor film, thereby crystallizing the target regions, and the semiconductor elements of at least drive circuit sections are formed in the crystallized regions. The regions are each uniformly crystallized and assume the same crystallized condition, and the drive circuit sections formed in these regions, therefore, do not differ in operating characteristic. Also, since the drive circuit sections, the switching elements of the pixel section, and the scanning electrode lines for connecting the drive circuit sections to the pixel units incorporated in the pixel section are formed in one and the same process, LC substrates can be manufactured easily and, hence, at low cost.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An apparatus for forming a thin crystalline semiconductor film comprising:

a processing chamber;

means located within said processing chamber, for supporting an object having an amorphous semiconductor film;

laser beam applying means for applying a laser beam onto a target region of the amorphous semiconductor film, to thereby effecting annealing on the target region;

memory means for storing first information which represents a band-gap spectral reflectance distribution pertaining to a reference semiconductor material;

laser-beam spectrum detecting means for detecting the laser beam applied onto said target region and reflected therefrom and for obtaining second information which represents a band-gap spectral reflectance distribution pertaining to said target region;

evaluation means for comparing said first information with said second information and evaluating a crystallized condition of said target region; and laser-beam energy adjusting means for adjusting energy of the laser beam on the basis of the crystallized condition evaluated by said evaluation means, to thereby reducing a difference between between said first information and said second information into a predetermined range.

* * * * *